United States Patent [19]

Beeken

[11] Patent Number: 5,163,174
[45] Date of Patent: Nov. 10, 1992

[54] POWER AMPLIFIER

[75] Inventor: Horst Beeken, Berlin, Fed. Rep. of Germany

[73] Assignee: Telefunken Sendertechnik GmbH, Berlin, Fed. Rep. of Germany

[21] Appl. No.: 635,884

[22] Filed: Jan. 3, 1991

[51] Int. Cl.[5] .............................. H03F 3/38
[52] U.S. Cl. ............................ 330/10; 330/207 A
[58] Field of Search ............... 330/10, 251, 207 A; 332/149, 179, 181; 435/108

[56] References Cited

U.S. PATENT DOCUMENTS

| 4,164,714 | 8/1979 | Swanson | 330/10 |
| 4,369,409 | 1/1983 | Kyrian et al. | 330/10 |

FOREIGN PATENT DOCUMENTS

| 0066904 | 12/1982 | European Pat. Off. | |
| 0263936 | 4/1988 | European Pat. Off. | |
| 0267391 | 5/1988 | European Pat. Off. | |
| 0349732 | 1/1990 | European Pat. Off. | 330/10 |
| 3502135 | 7/1986 | Fed. Rep. of Germany | |
| 3907919 | 1/1990 | Fed. Rep. of Germany | |

OTHER PUBLICATIONS

European Search Report "PTL-UL/P3907919" Dec. 4, 1990, four pages.
P. 471 from Article entitled "Transformer" relating to three-phase transformers and in particular Wye or delta (undated).

Primary Examiner—James B. Mullins
Attorney, Agent, or Firm—Spencer, Frank & Schneider

[57] ABSTRACT

A power amplifier for amplifying analog input signals includes one or a plurality of amplifier modules which are connected in series on their output sides, which preferably each include a double mains unit having three outputs and a mains transformer connected in a wye pattern on its secondary side, with the two outer outputs each being connected by way of a main switch with the filter choke of a lowpass filter and by way of a free running diode connected between the main switch and the filter choke with the middle output while the middle output, in turn, is connected directly with the secondary side wye point of the transformer and, on the other hand, directly with the junction of the two series connected filter capacitors of the two lowpass filters. Due to this direct connection of the wye points with the lowpass filters, the normally damaging build-up capacitances of the transformer become integral components of the lowpass filters so that the high switching frequencies are no longer present at the transformer but only the lower frequency input signal which results in a considerable reduction of the power loss in connection with the build-up capacitances of the transformer. in order to reduce so-called negative crest mode distortions, each free running diode is connected in parallel with an auxiliary switch which is operated in push-pull to the associated main switch.

19 Claims, 14 Drawing Sheets

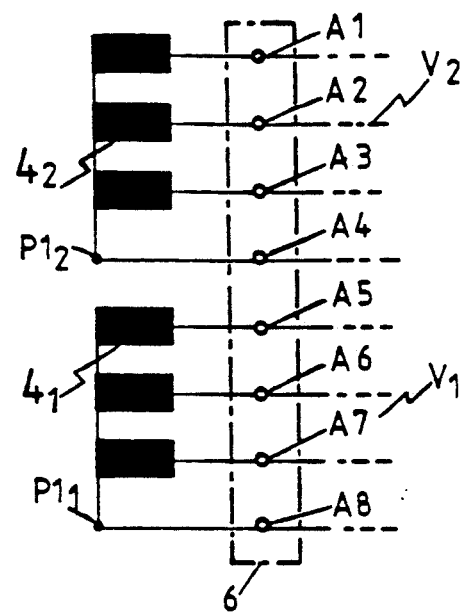
FIG. 20
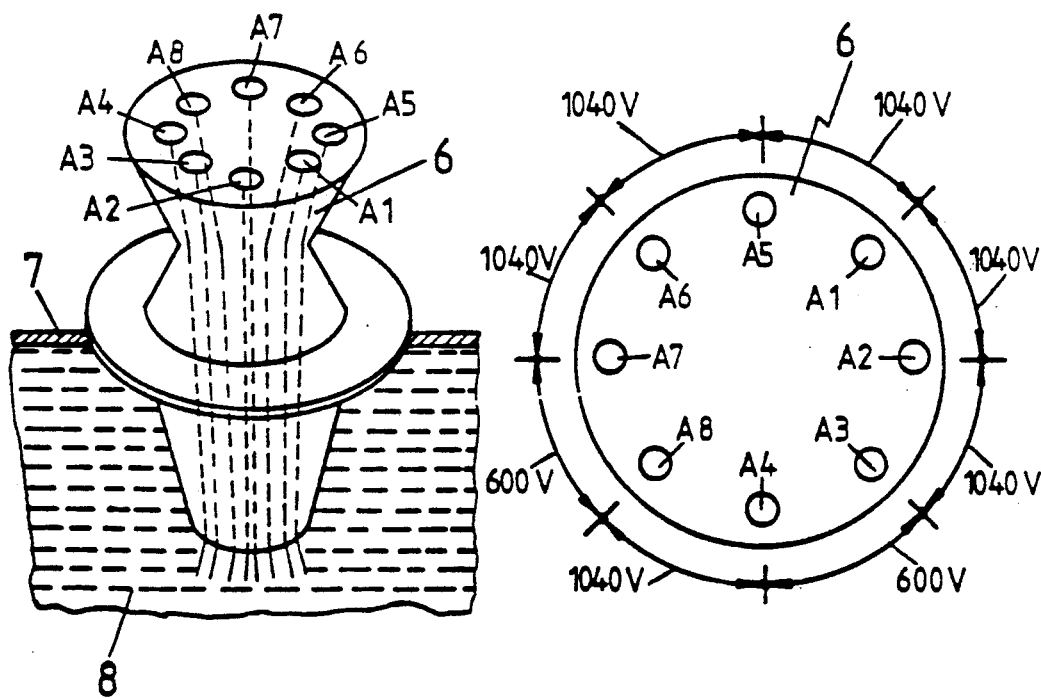
FIG. 21
FIG. 22

POWER AMPLIFIER

BACKGROUND OF THE INVENTION

1. Field of the Invention

The invention relates to a power amplifier for amplifying an analog input signal.

2. Background Information

Such a power amplifier is disclosed, for example, in DE-A1-3,502,135. the power amplifier disclosed therein is composed of a plurality of identical individual amplifiers which are connected in series at their outputs and are each composed of a switching amplifier connected to the secondary and a subsequently connected lowpass filter.

According to FIG. 1, the switching amplifiers connected to the secondaries are each composed of a direct voltage mains unit UB1 and UB2, respectively, and a subsequently connected switch SCH1 and SCH2, respectively, which is actuated by a pulse train derived from the analog input signal to be amplified. In order to bridge the respective direct voltage mains unit UB1 and UB2, when the respective switch SCH1, SCH2 is open, a free running diode FD1, FD2, respectively, is provided at its output.

Such a direct voltage unit (e.g. UB1 in FIG. 1) is customarily composed of a mains transformer configured, for example, as a three-phase transformer having three delta connected primary windings and three wye connected secondary windings. Customarily the secondary windings are connected to a three phase bridge rectifier which, in order to smooth the resulting raw direct voltage, is followed by a filter member including a filter choke and a filter capacitor. The filter choke is connected between the positive pole of the rectifier circuit and the output terminal having the higher potential, while the filter capacitor is connected in parallel with the two output terminals.

According to the present state of the art, a mains voltage of 380 V at a frequency of 50 Hz or 60 Hz can be employed at the primary side of the mains transformer for a direct voltage mains unit up to a power of approximately 200 kW at a direct voltage of approximately 30 kV. For powers above 250 kW, the primary currents occurring at a 380 V mains voltage become very high and thus difficult to manage from an engineering point of view. In this case, voltages between 4 $kV_{eff}$ and 30 $kV_{eff}$ are employed on the primary side of the mains transformer.

A very economically producible mains transformer is configured as a so-called cast resin transformer which makes it possible to bring the many terminals of the secondary windings out in an economical manner. However, such a cast resin transformer can be employed economically only for a primary voltage of 380 V.

FIG. 2 is a cross-sectional view of such a cast resin transformer TR which is configured as a three-phase transformer. Three coil units r, s, t corresponding to the three phases of the three-phase current are wound around an iron core 1 configured, for example, to have a so-called EI-type lamination. Each coil unit is composed of a primary coil 2 wound directly around the iron core 1, a grounded shielding 3 surrounding the primary coil, and a secondary winding 4 whose windings are encased in cast resin surrounding the shield. For electrical insulation, an air channel 5 having, for example, a dielectric strength of 50 kV is provided between shielding 3 and secondary winding 4. Between iron core 1 and primary winding 2, between primary winding 2 and shielding 3, between shielding 3 and secondary winding 4 there exists in each case a dielectric strength of at least 2.5 kV. FIG. 2 shows that air channel 5 which, in a disadvantageous manner, takes up a large amount of space, is provided only once. Electrical insulations for insulating voltages of 2.5 kV, however, can be provided in a much more space saving manner, for example with the aid of plastic sheets. The terminals can then be easily brought out of the cast resin on the exterior face of the cast resin coil.

If now a mains transformer were constructed according to the same technology for powers greater than 250 kW, that is for a mains input voltage of, for example 20 kV, the insulating air channel 5 for 50 kV would have to be provided three times, namely between the iron core 1 and primary winding 2, between primary winding 2 and shielding 3 and between shielding 3 and secondary winding 4. Such a mains transformer would have very large dimensions and could therefore not be employed economically.

For such high power applications (greater than 250 kW) it is therefore possible only to employ a mains transformer in which a liquid insulating material, for example a so-called transformer oil having the highest possible dielectric strength, is employed. Although this permits the construction of a spatially relatively small mains transformer since the electrically insulated distances can be selected to correspond to the minimum dielectric strength of the liquid insulating material, the dielectric strength with respect to air is considerably higher and is, for example, at least 30 kV/2.5 mm.

One embodiment of such a mains transformer is shown in a sectional view in FIG. 3. The longitudinal sectional view shows one leg r of a three-phase transformer TR filled with liquid insulating material 5' (e.g. transformer oil) and comprising an iron core 1, a primary winding 2, a grounded shielding 3 as well as several secondary windings $4_1$ to $4_3$ arranged in the chamber winding technique. Due to the rotational symmetry of the structure of leg r, only one half of the leg r is illustrated. The axis of symmetry SA here extends through iron core 1.

The lowpass filters in the prior art power amplifier are each composed of an LC half member including a filter coil FL1 and FL2, respectively, and a filter capacitor FC1 and FC2, respectively. The upper cut-off frequency of the lowpass filters is dimensioned so that the analog input signal appears amplified at the amplifier output and is transmitted to the load R essentially without distortion.

In the prior art power amplifier, the series connection of the individual amplifiers is realized in that the filter capacitors FC1 and FC2, respectively, of the individual LC half members are connected in series.

Similar power amplifiers, but equipped with switching amplifiers at their primaries and with connected individual amplifiers are disclosed in EP-A1-0,025,234 (U.S. Pat. No. 4,369,409) and DE-A1-2,841,833 (U.S. Pat. No. 4,164,714).

In order to actuate the switching elements in the individual switching amplifiers, the prior art power amplifiers employ pulse duration modulated ("PDM") pulse trains which are derived in known circuits by high frequency sampling of the analog input signal and in which the width and the duration of the individual pulses is directly proportional to the sampled momentary value of the amplitude of the analog input signal. Insofar as the sampling or switching frequency (which is constant for PDM) is at least twice as high as the maximum permissible frequency of the input signal, each individual one of these pulse trains contains the complete information about the analog input signal to be amplified, with special embodiments of such power amplifiers providing for the analog input signal to be sampled by the pulse trains with a shift in phase relative to one another. The cut-off frequency of the individual lowpass filters is therefore selected so that the sampling frequency including its harmonics are filtered out of the pulse duration modulated power pulses at the output of the respective switching amplifier, and in this way, the analog input signal is amplified and is put out essentially without distortion at the output of the lowpass filter.

The dimensioning of the individual lowpass filters in the prior art power amplifiers is based solely and uniquely on the capacitances and inductances of the filter capacitors (FC1 and FC2 in FIG. 1) and filter coils (FL1 and FL2 in FIG. 1) employed in the lowpass filters.

While in the prior art power amplifiers with correspondingly dimensioned lowpass filters, an almost distortion-free amplification of the analog input signal can definitely be realized, the high efficiency theoretically to be expected due to the use of switching amplifiers instead of linear amplifiers is in no way realized in practice with the prior art amplifiers.

SUMMARY OF THE INVENTION

It is therefore the object of the invention to provide a power amplifier of the above mentioned type which has the greatest possible efficiency with simultaneously the least possible distortion of the amplifier output signal.

A significant reason for the surprisingly low efficiency of the prior art power amplifiers in practice is the power loss caused by the high sampling and switching frequency in connection with the build-up capacitances of the mains transformers employed in the switching amplifiers. In transformers TR equipped with grounded shielding 3 as, for example, in the transformers depicted in FIGS. 2 and 3, particularly the shielding capacitances CT between shielding 3 and secondary windings 4 of the mains transformer (in mains transformers without shielding, correspondingly the winding capacitances between primary and secondary transformer windings) are responsible for the high power loss in the transformers. However, transverse capacitances CQ between spatially adjacent secondary windings ($4_1$, $4_2$ and $4_3$ in FIG. 3) may also contribute considerably to these losses.

The invention now resides in the fact that pairs of directly series connected individual amplifiers are combined into an amplifier module in such a way that these actually harmful build-up capacitances of the transformers, particularly the above-mentioned shielding capacitances CT and/or transverse capacitances CQ, become part of the individual lowpass filters so that the high sampling and switching frequencies are no longer present at the transformers, as in the prior art power amplifiers, but only the lower frequency analog input signal to be sampled, which results in a corresponding reduction of the power losses in connection with the build-up capacitances of the mains transformers. Connected with this is a corresponding increase in the efficiency of the power amplifier.

Advisably, the dimension of the individual lowpass filters, with respect to their selected upper cut-off frequency, will include the transformer capacitances (for example, the above-mentioned shielding and/or transverse capacitances) which are "integrated" as lowpass filter components, thus reducing the actual expenditures for the filter.

It is understood that, in addition to the shielding and transverse capacitances CT and CQ, respectively, mentioned here and hereinafter as an example, other "integratable" transformer capacitances can also be considered in the dimensioning of the selected individual lowpass filters.

Which ones of the "integratable" transformer capacitances are significant in this connection depends to a decisive extent on the selected configuration of the mains transformer.

The power amplifier according to the invention will now be described in greater detail with reference to the drawing figures and particularly in connection with a modulation amplifier for an amplitude modulated high power transmitter. However, the invention is not limited to this particular application. Rather, the invention can be employed quite generally and with high efficiency for the low distortion amplification of analog signals and is particularly suitable for high power applications in the low and high frequency domain. Another advantageous field of application is the field of high voltage direct current supplies, for example for supplying magnetic current in particle accelerator systems.

Figure 4:
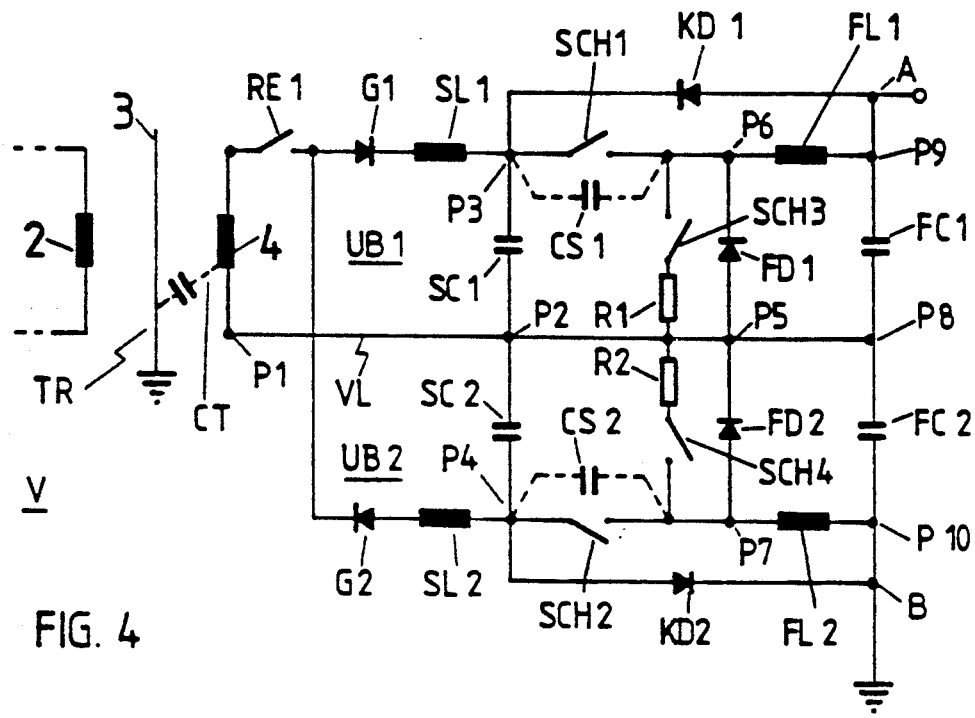
FIG. 4, an advantageous single-phase embodiment of a power amplifier according to the invention including single-stage lowpass filters.
Figure 5:
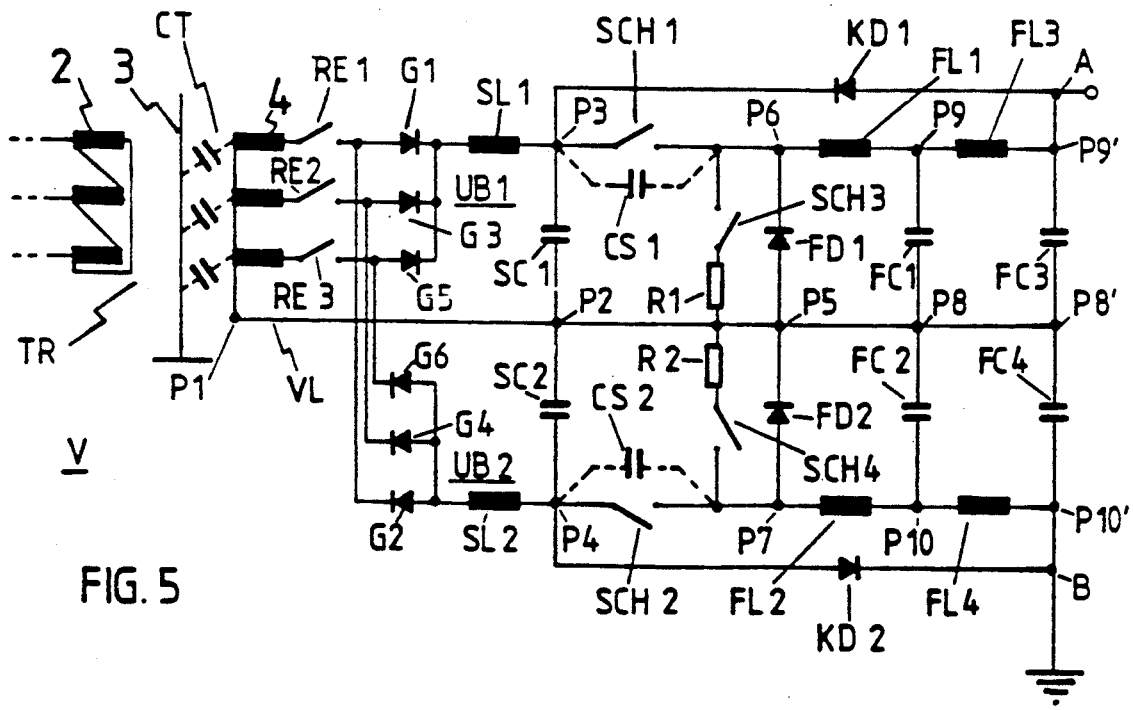
FIG. 5, a further advantageous embodiment in a three-phase configuration of the power amplifier according to the invention including two-stage lowpass filters.
Figure 12:
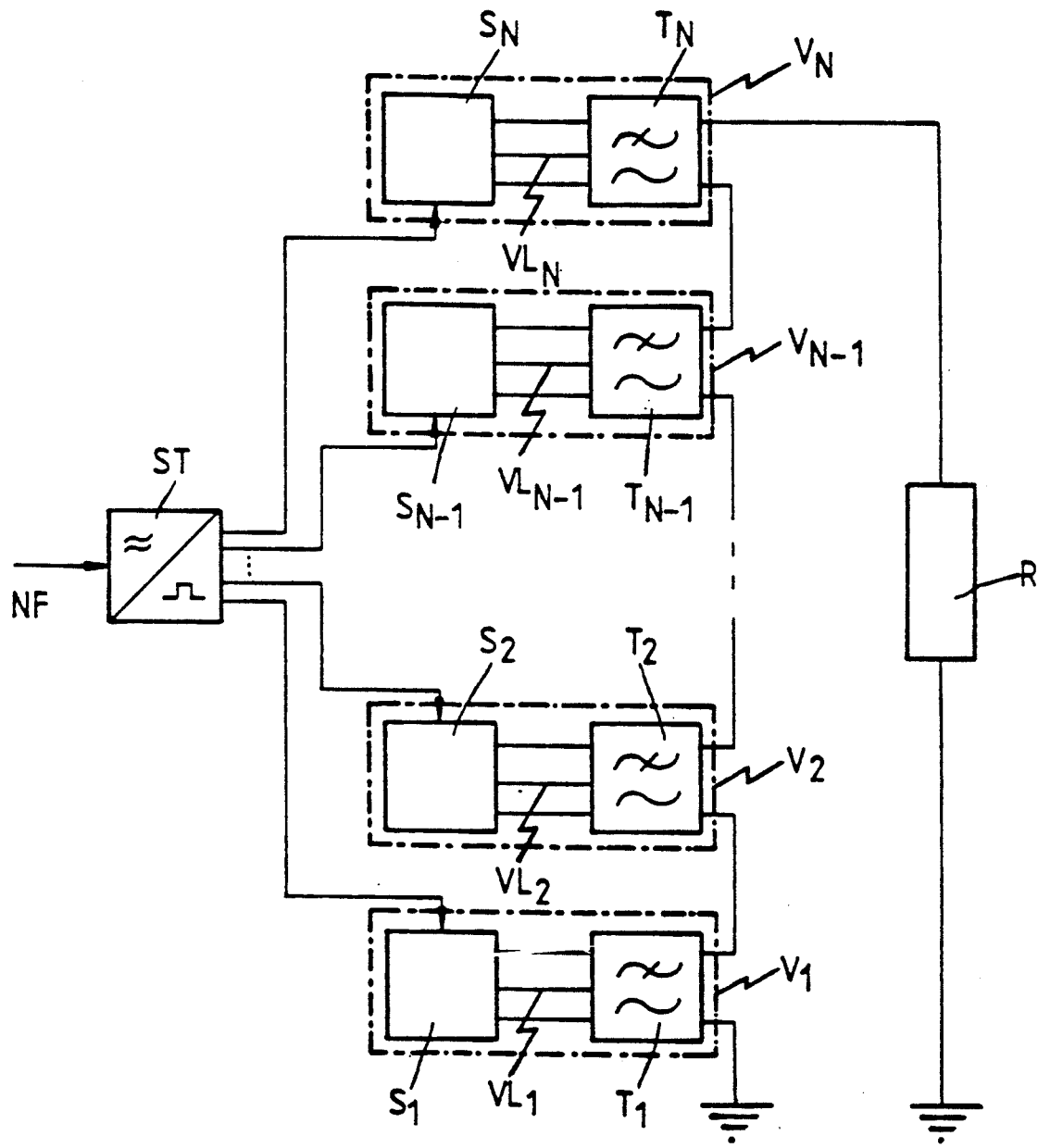
FIG. 12, a block circuit diagram of an advantageous embodiment of the power amplifier according to the invention for high voltages.
Figure 13:
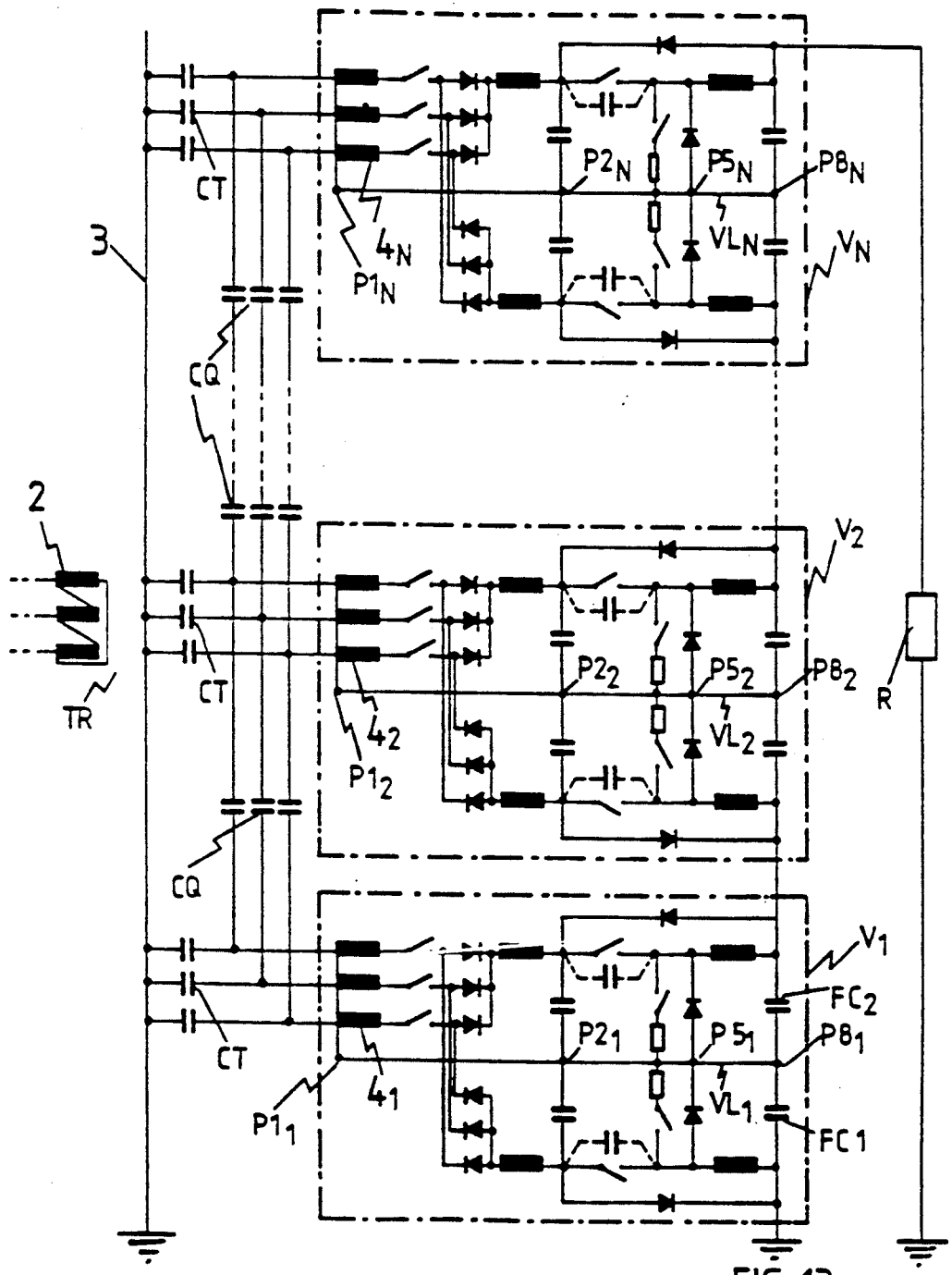
FIG. 13, a more detailed embodiment of the power amplifier according to the invention as shown in FIG.
Figure 14:
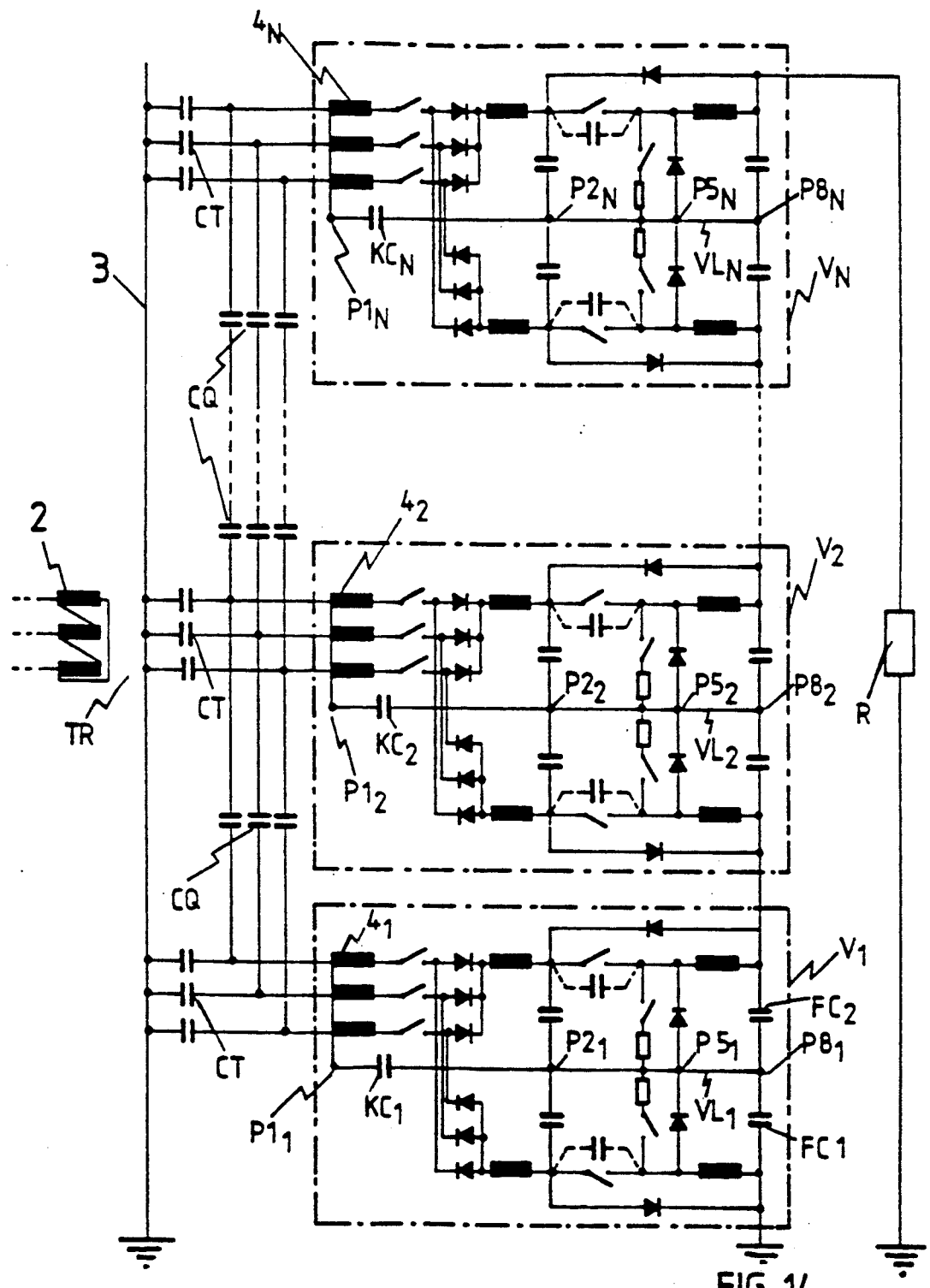
Figure 15:
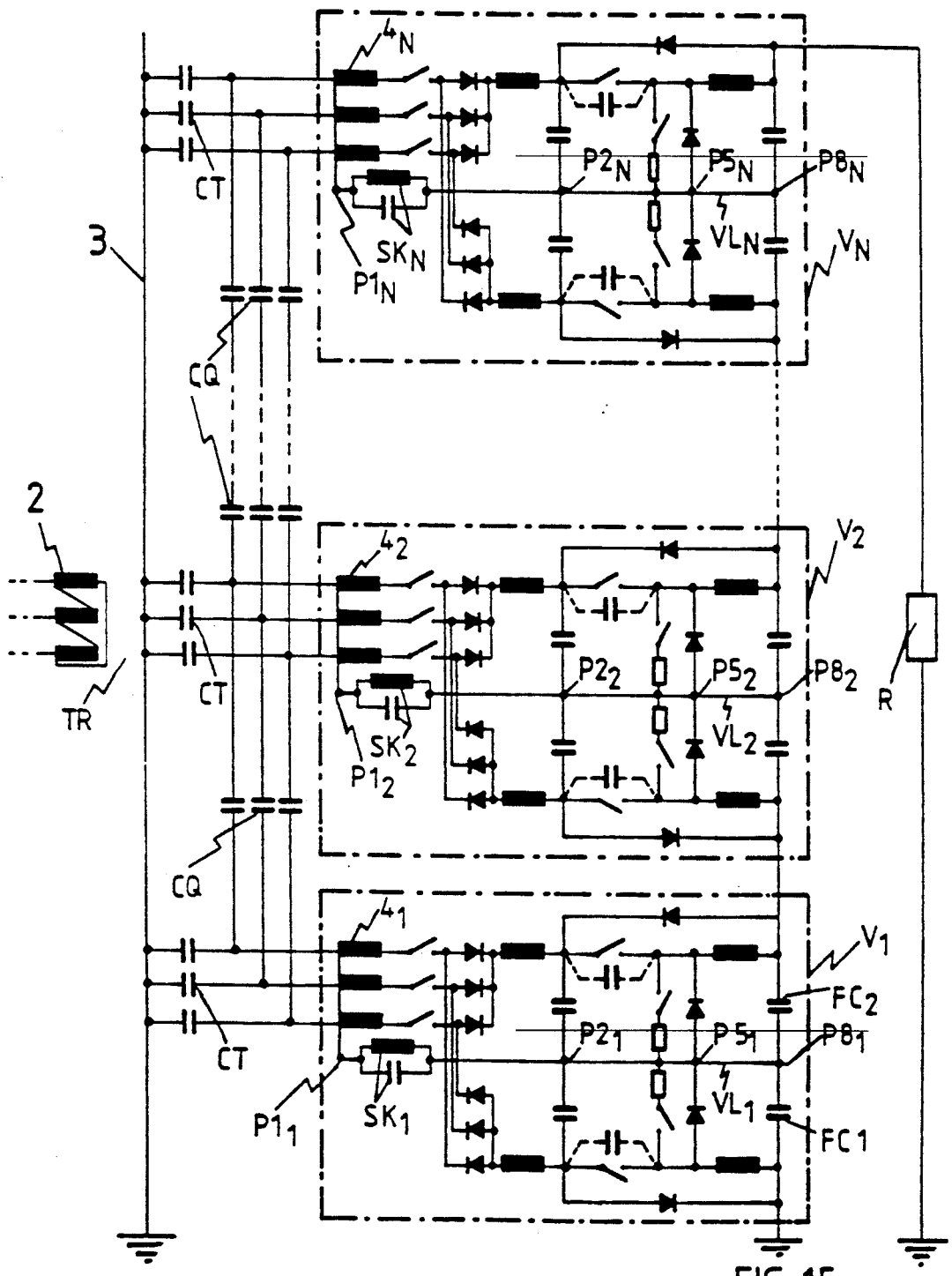
Figure 16:
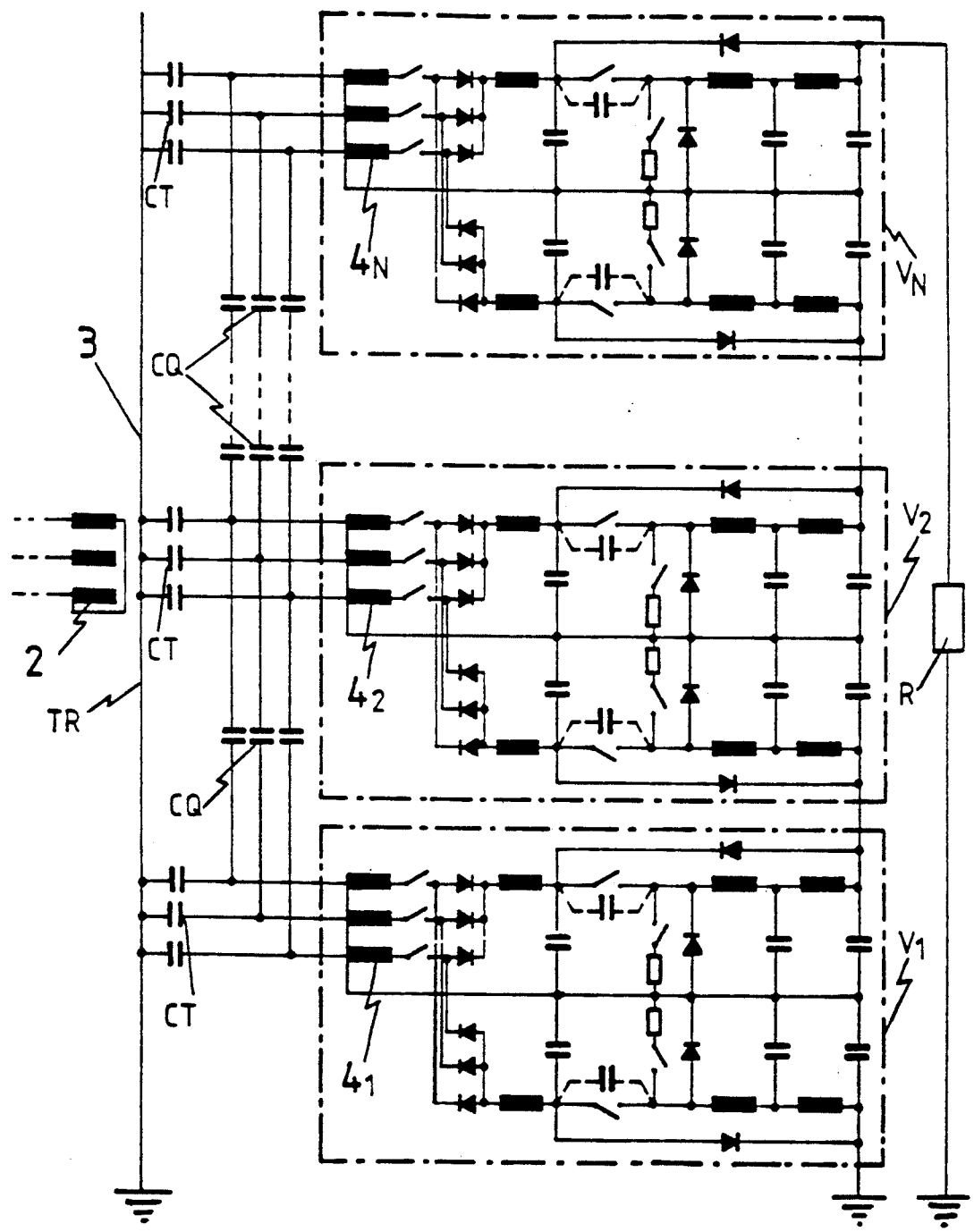
Figure 17:
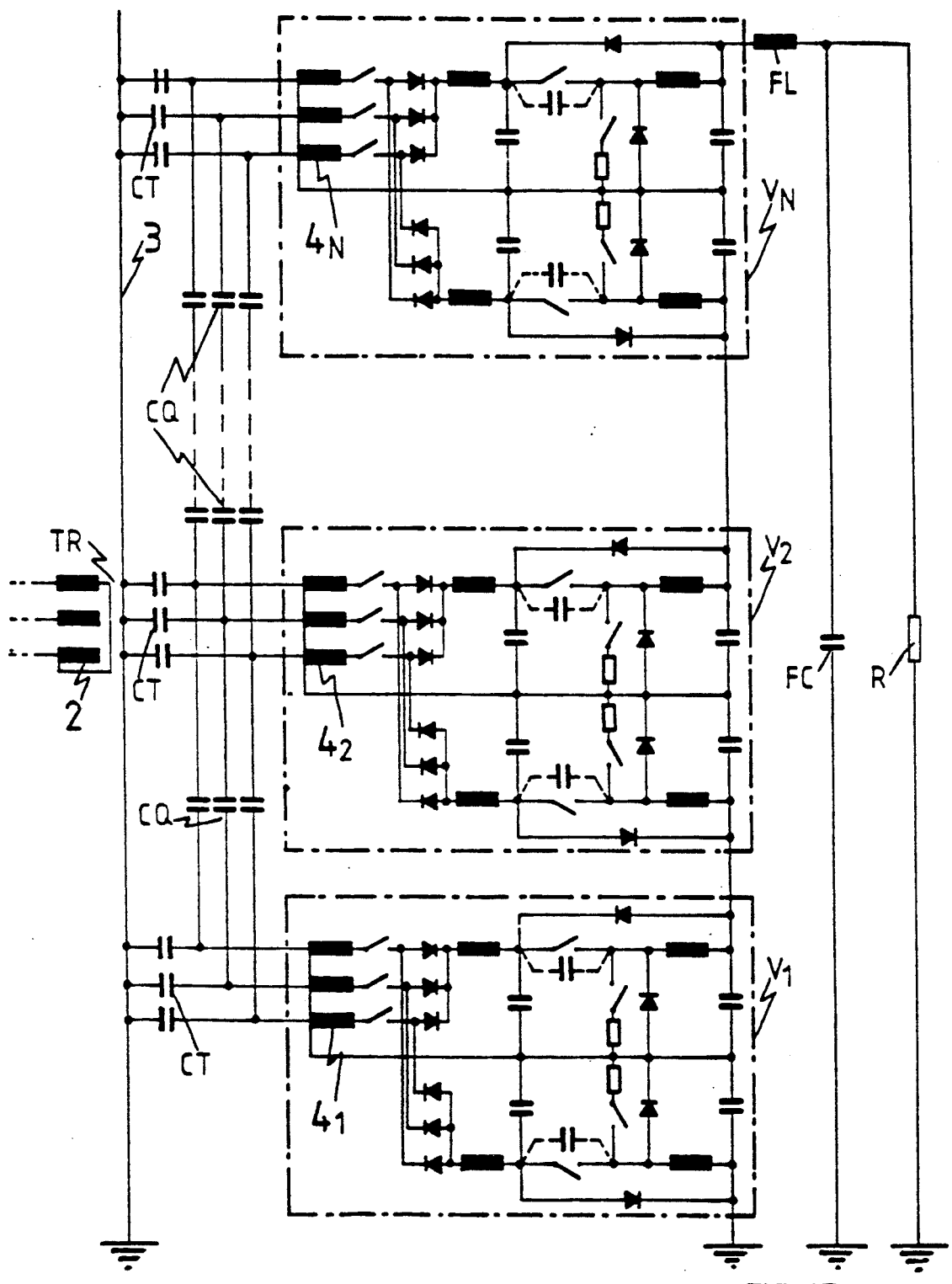
Figure 18:
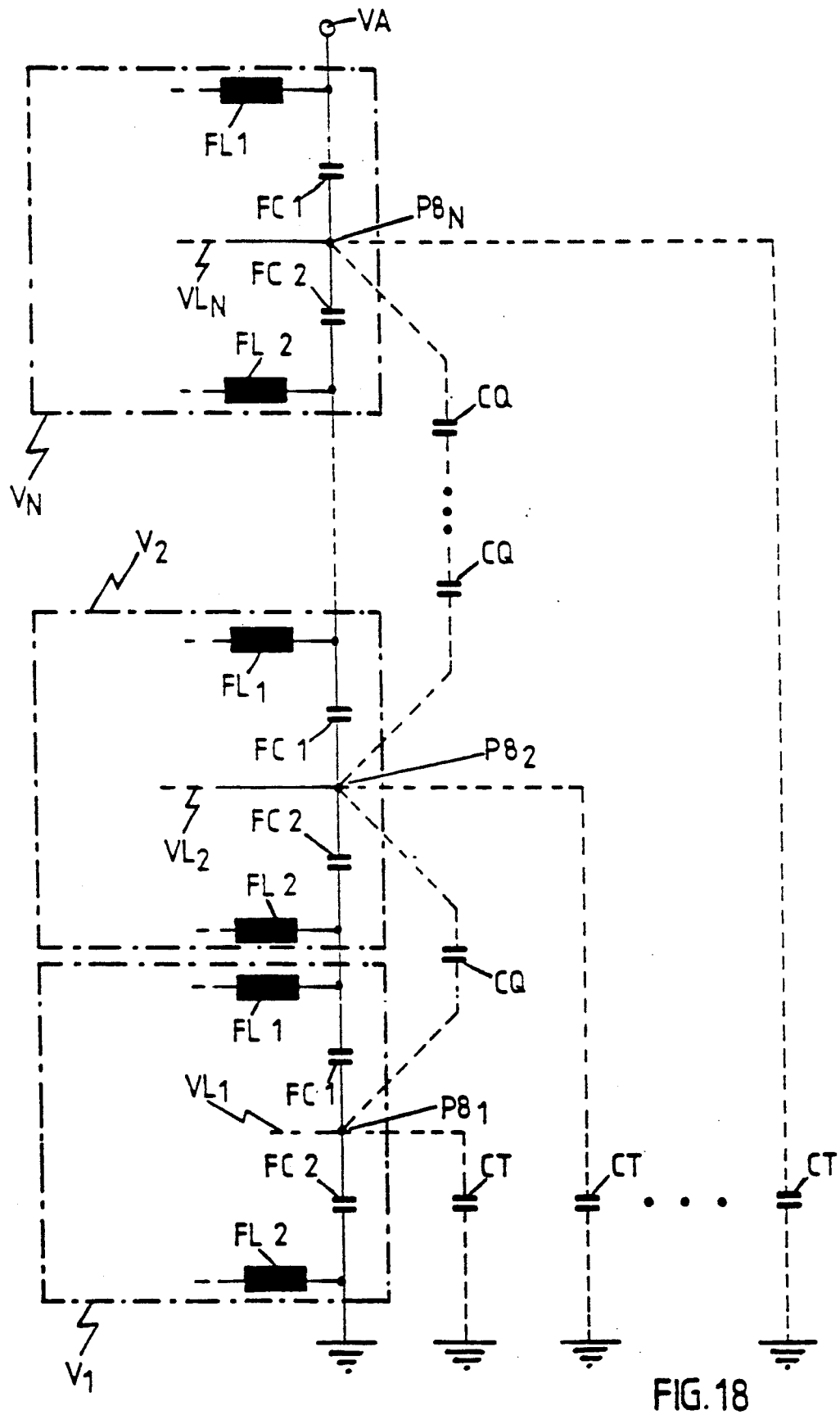
Figure 19:
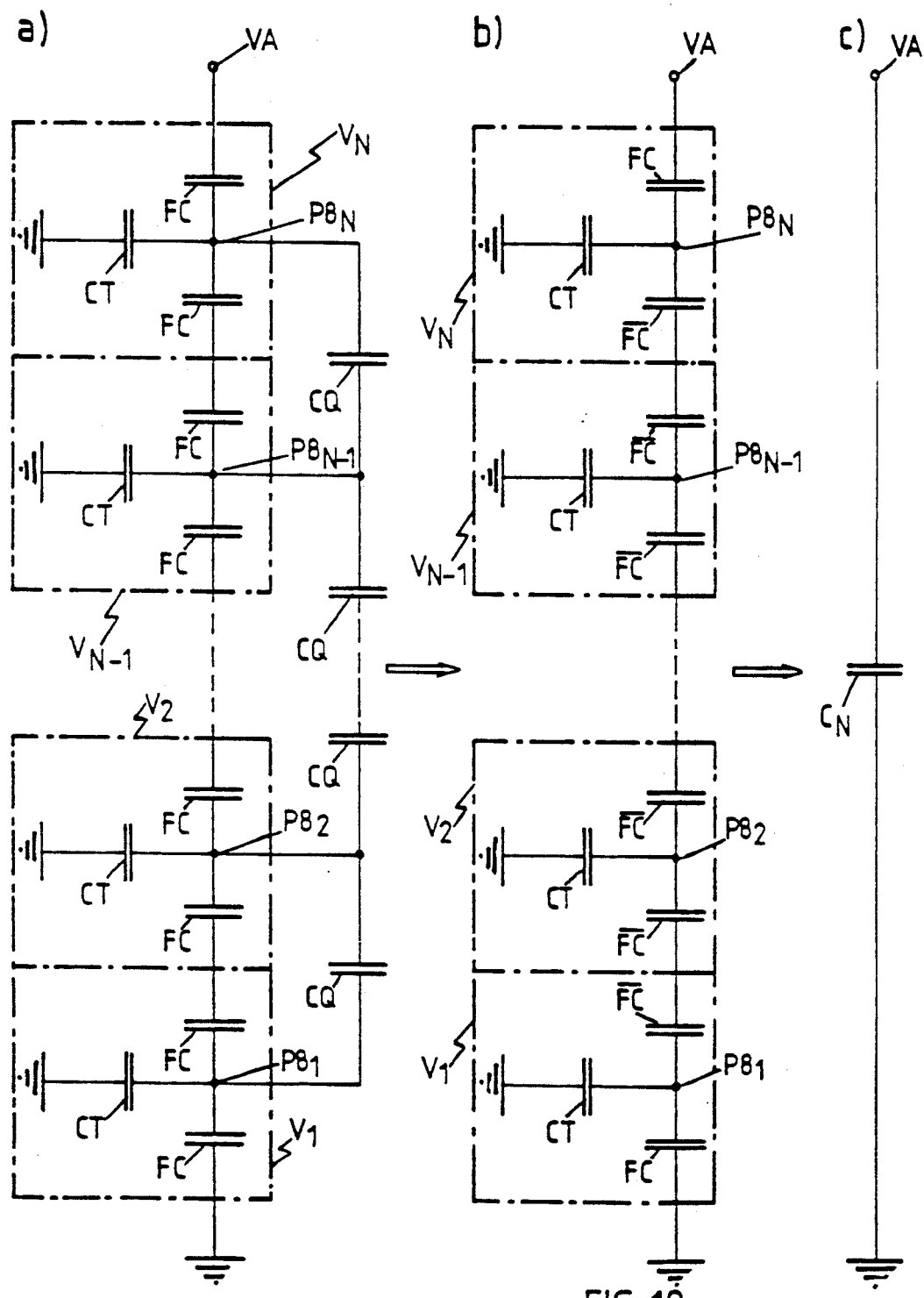

12 including a three-phase amplifier module as shown in FIG. 4;

FIG. 14, a first modification of the power amplifier according to the invention as shown in FIG. 13, equipped with a coupling capacitor in each one of the throughgoing connection lines of the individual modules;

FIG. 15, a second modification of the power amplifier according to the invention as shown in FIG. 13, including a rejection circuit in each one of the throughgoing connection lines of the individual modules;

FIG. 16, a more detailed further embodiment of the power amplifier according to the invention as shown in FIG. 12 equipped with amplifier modules as shown in FIG. 5;

FIG. 17, a third modification of the power amplifier according to the invention as shown in FIG. 13 equipped with an additionally connected lowpass filter;

FIG. 18, an equivalent circuit diagram, in section, for the power amplifier according to the invention as shown in FIG. 13, including filter capacitors and integrated transformer capacitances;

FIG. 19, an equivalent circuit diagram, in section, for the power amplifier according to the invention as shown in FIG. 13 for the calculation of the equivalent capacitance $C_N$ for the capacitances of the integrated lowpass filters;

FIG. 20, a detail view of an advantageous embodiment of the three-phase mains transformer employed with ports on its secondary side for two amplifier modules by way of an insulated support;

FIGS. 21 and 22, an insulated support as shown in FIG. 20 in a side view (FIG. 21) and in a top view (FIG. 22).

Figure 23:
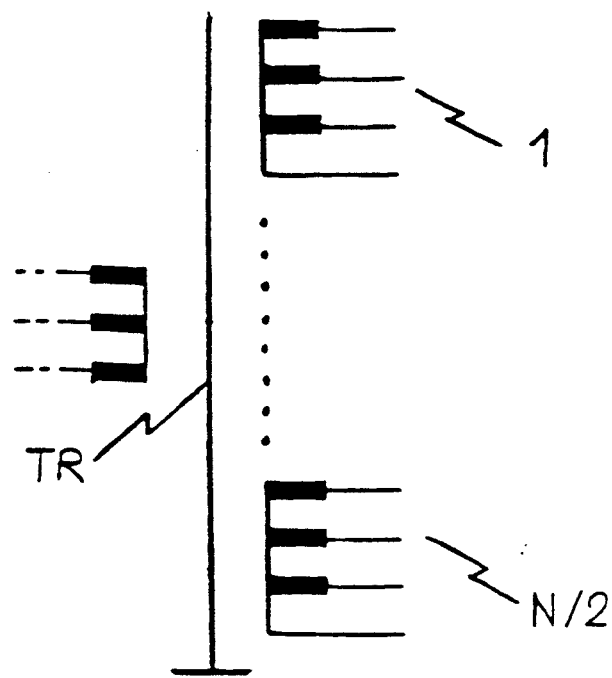
Figure 23:
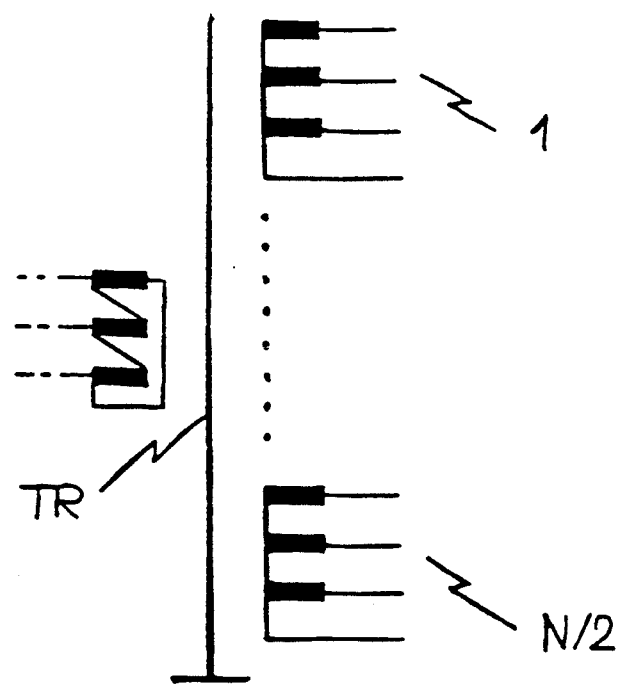

FIG. 23 shows and embodiment wherein two three-phase mains transformers are employed.

DETAILED DESCRIPTION OF THE PREFERRED EMBODIMENTS

Figure 9:
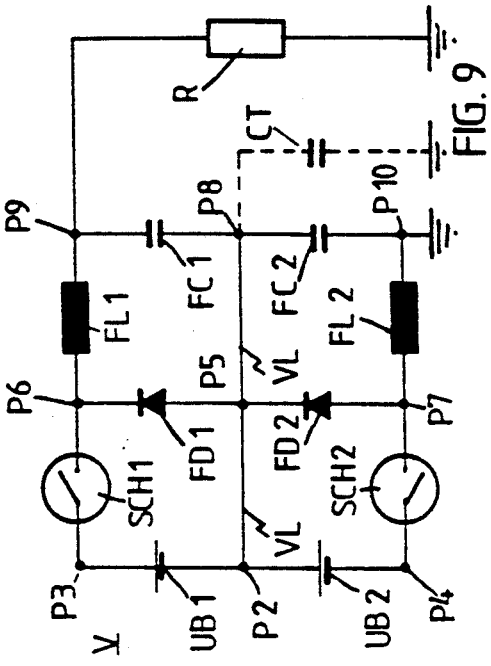
FIGS. 8–9, equivalent circuit diagrams of the power amplifier according to the invention as shown in FIG. 4 with "integrated" transformer shielding capacitance.
Figure 8:
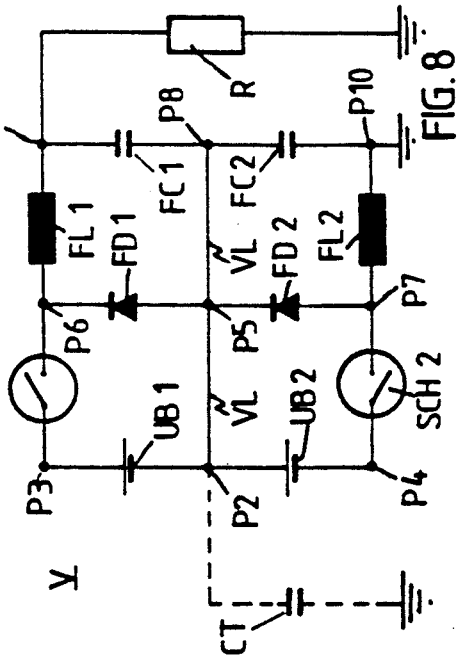

The power amplifier according to the invention as shown in FIG. 4 and as indicated by the equivalent circuit diagrams of this circuit in FIGS. 8 and 9, is composed of two individual amplifiers which are combined into an amplifier module V and each comprise a secondary connected switching amplifier including a direct voltage mains unit UB1 and UB2, respectively, a switch SCH1 and SCH2, respectively, and a free running diode FD1 and FD2, respectively, as well as a lowpass filter composed of a filter coil FL1 and FL2, respectively, and a filter capacitor FC1 and FC2, respectively.

In this amplifier module V according to the invention, the direct voltage mains units UB1 and UB2 and the free running diodes FD1 and FD2 of the two switching amplifiers as well as the filter capacitors FC1 and FC2 of the two lowpass filters are respectively connected in series, and the junctions P2, P5 and P8 between the respective pairs of components of these three series connections are connected with one another by a throughgoing connecting line VL. The outer end points P3, P6, P9 and P4, P7, P10, respectively, of these three series connections are each connected with one another by way of a further series connection of a switch SCH1 and SCH2, respectively, and a filter coil FL1 and FL2, respectively, with the series connection of free running diodes FD1 and FD2 and its two end points P6 and P7, respectively, being connected in each case between switch SCH1 and SCH2, respectively, and filter coil FL1 and FL2, respectively.

The series connection of the two direct voltage mains units UB1 and UB2 is realized in this amplifier module V in the form of a known double mains unit as disclosed, for example, in TELEFUNKEN Röhrentaschenbuch [Tube Handbook], 1956 Edition, page 310.

This double mains unit includes a mains transformer TR which, for example in the embodiment of FIG. 4, is a single-phase transformer including a primary winding 2 and a secondary winding 4 and which, in order to dissipate capacitive switching currents, includes a grounded shielding 3.

For the sake of clarity, this drawing figure, as well as the figures following it, include no further details of the configuration of the transformer employed (iron core, insulating materials, etc.), although they will certainly have to be considered in a concrete realization.

The one end of the secondary winding is connected with two rectifiers G1 and G2 which are connected with opposite polarities and which, with respect to the other end P1 of the secondary winding, generate two raw direct voltages of different polarity that are filtered, that is, smoothed in the respectively connected LC filter member each composed of a filter choke SL1 and SL2, respectively, and a filter capacitor SC1 and SC2, respectively. In this double mains unit, filter capacitors SC1 and SC2 are connected in series, with their common connecting point P2 being connected by way of the throughgoing connecting line VL, with the other end P1 of secondary winding 4.

The smoothed direct voltage present at the respective filter capacitor SC1 and SC2, here constitutes the output voltage of the respective direct voltage mains unit UB1 and UB2, in FIGS. 8 or 9, so that the junctions P3, P2 and P4, respectively, of filter capacitors SC1 and SC2, respectively, in FIG. 4 are identical with junctions P3, P2 and P4, respectively, of the two series connected direct voltage mains units UB1 and UB2, respectively, in FIG. 8 or 9.

The symmetrical structure of the amplifier module V according to the invention, with its throughgoing connecting line VL as the "axis of symmetry", creates in the amplifier module V according to the invention a continuous symmetrical connection between the secondary winding 4 of the mains transformer (TR), on the one hand, and the filter capacitors FC1 and FC2, respectively, of the lowpass filters, on the other hand, thus connecting, in particular, the build-up capacitances resulting from the secondary windings of the mains transformer TR directly with the lowpass filters and "integrating" them.

In the simplified equivalent circuit diagram of FIG. 8, the shielding capacitance CT, for example, between secondary winding 4 and grounded shielding 3 which constitutes a significant percentage of these damaging buildup capacitances and which is shown in dashed lines in FIG. 4, is connected, to ground at one end and (because of the direct connection between points P1 and P2 in FIG. 4) at the other end with the junctions P2 between the two series connected direct voltage mains units UB1 and UB2.

Because of the direct symmetrical connection VL between junctions P2 and P8, an equivalent to this is the equivalent circuit diagram of FIG. 4 shown in FIG. 9 in which the shielding capacitance CT is connected in parallel with filter capacitor FC2 and thus forms an integral component of the respective lowpass filters FL2, FC2.

The great advantage of this circuit according to the invention is that, due to this integration in the lowpass filters of, in particular, the build-up capacitances of the mains transformer caused by the secondary windings, the high sampling and switching frequencies are no longer present at the transformer, as they were in the prior art power amplifiers, but only the lower frequency input signal to be sampled, so that the damaging build-up capacitances are recharged only at the frequency of the input signal (and no longer at the switching frequency), which is concomitant with a corresponding reduction of the power loss in connection with the build-up capacitances of the mains transformer and with a corresponding improvement of the efficiency of the power amplifier.

A qualitative comparison of the power amplifier according to the invention with, for example, a power amplifier as disclosed in DE-A1-3,635,365 or EP-A1-0,066,904 may serve to clarify these facts, reference being made to equivalent circuit diagrams for both these amplifiers as shown in FIGS. 8 and 9 and 6 and 7, respectively.

Figure 6:
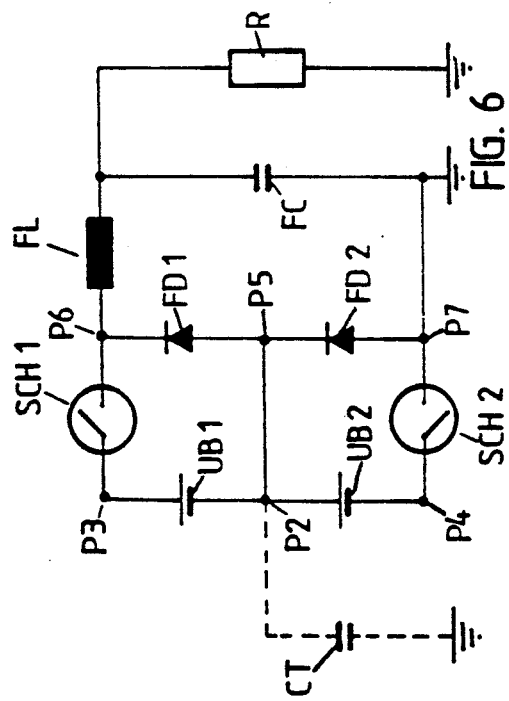

The prior art switching amplifier also employs the double mains unit known per se in order, however, as shown in FIG. 6, to realize two series connected switching amplifiers UB1, SCH1, FD1 and UB2, SCH2, FD2, respectively, which are followed by a common lowpass filter FL, FC.

Figure 7:
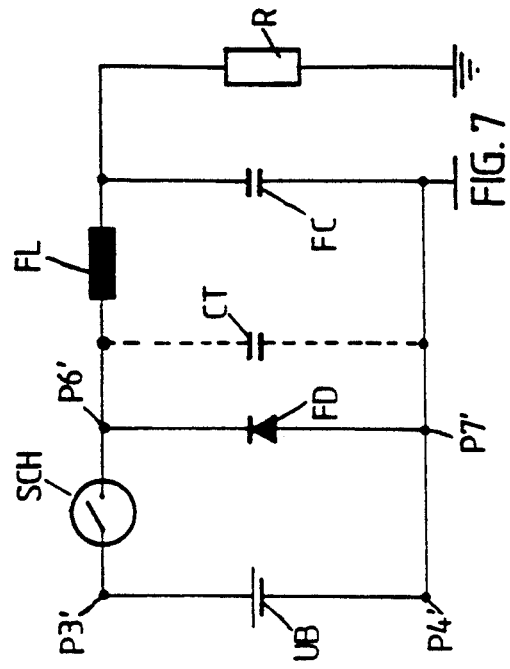
FIGS. 6–7, equivalent circuit diagrams of a prior art power amplifier without "integration" of the transformer shielding capacitance.

Since in this circuit the throughgoing symmetrical connection between the secondary winding of the mains transformer and the lowpass filter is absent, a case as shown in FIG. 7 in which the equivalent circuit diagram for synchronously actuated switches SCH1 and SCH2 includes a mains unit UB (of twice the output voltage), a switch SCH and a free running diode FD, the damaging shielding capacitance CT is no longer parallel to filter capacitor FL but parallel to free running diode FD and is therefore recharged at the clock pulse of the much higher switching frequency, which brings about a corresponding worsening of the efficiency of the power amplifier.

FIG. 5 shows a further, particularly advantageous embodiment of the amplifier module V according to the invention which differs from the circuit shown in FIG. 4 in that instead of the single-phase configured mains transformer, a three-phase mains transformer is provided here whose primary side is connected in a delta pattern and whose secondary side is connected in a wye P1, with two three-phase, wye connected rectifier circuits G1, G3, G5 and G2, G4, G6, respectively, connected at opposite polarities being connected on its secondary side and wherein the junction P2 of the series connected filter capacitors SC1 and SC2 is connected directly with the wye point P1; and instead of the single-stage lowpass filters there are provided lowpass filters FL1, FC1; FL3, FC3 and FL2, FC2; FL4, FC4, respectively, which here, as an example, are configured in two stages and which take care of even greater attenuation of the switching frequency and its harmonics, that is, even less distortion of the amplifier output voltage.

In the equivalent circuit diagram of this circuit corresponding to FIG. 9, the shielding capacitances between the individual secondary windings 4 and shielding 3 in FIG. 5 would be connected in parallel with filter capacitor FC4 of the second filter stage FL4 FC4 of the lower lowpass filter and combined into a common shielding capacitance CT.

Switches SCH1 and SCH2, respectively, of the amplifier module V according to the invention as shown in FIG. 4 or 5 may be actuated, that is, turned on and off, independently of one another. The pulse trains derived from the input signal here determine the time sequence of the switching pulses. In the ideal case, the resulting output voltage $U_A$ at the output of amplifier module V may take on, statically or dynamically, any desired value between 0 volt (both switches off) and $2 U_B$ (both switches on), as a function of the pulse trains or switching pulses, respectively, with $U_B$ being the output voltage of a direct voltage mains unit UB1 or UB2.

Advantageously, however, the two switches SCH1 and SCH2, respectively, of the amplifier module V according to the invention are actuated in synchronism, that is at the same time, for example by means of pulse frequency modulated pulse trains of a constant pulse duration $t_{on}$=const or, preferably, with pulse duration modulated pulse trains since, in that case, the circuit of FIG. 5 acts like a three-phase bridge circuit which makes it possible to render harmless the actually damaging build-up capacitances of the mains transformer by their integration in the lowpass filters and which, at the same time, has the good efficiency of a three-phase bridge circuit.

If the amplifier module V according to the invention is actuated by pulse duration modulated pulse trains and if the load resistance R is constant, the output voltage $U_A$ and the output current theoretically change linearly with the keying ratio value $V_Y$, that is, with the ratio of the ON period $T_{ON}$ of the synchronously actuated switches SCH1 and SCH2 to the period duration T of the switching oscillation. In practice, however, this linear relationship does not apply. The actual output voltage $U_A$ increasingly differs from the theoretical value with decreasing keying ratio value $V_Y$ so that, in the region of small input signal amplitudes and narrow switching pulses, so-called "negative crest mode distortions" result in the output voltage $U_A$.

These negative crest mode distortions are produced by the charging and discharging of undesirable switching capacitances CS on the side of filter coils FL1 and FL2 where they are charged with switching pulses. These switching capacitances are essentially the output capacitances CS1 and CS2 of the employed switches SCH1 and SCH2 which, in principle, are connected in parallel with the associated switches as indicated in the section of the equivalent circuit diagram for FIG. 4 shown in FIG. 10.

Figure 10:
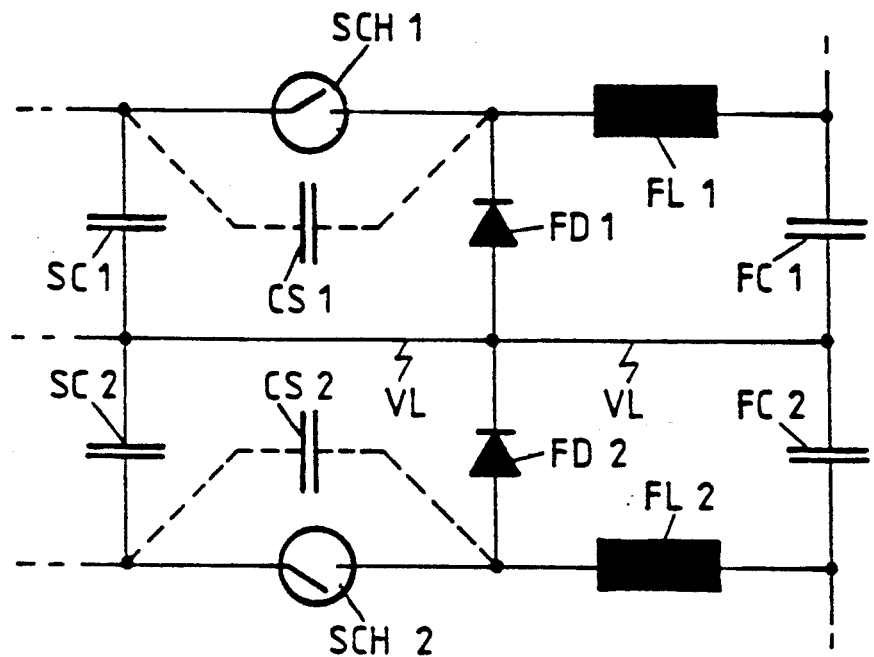
FIG. 10 and FIG. 11, equivalent circuit diagrams of a section of the power amplifier according to the invention as shown in FIG. 4 or 5, including the switches and the switch output capacitances.
Figure 11:
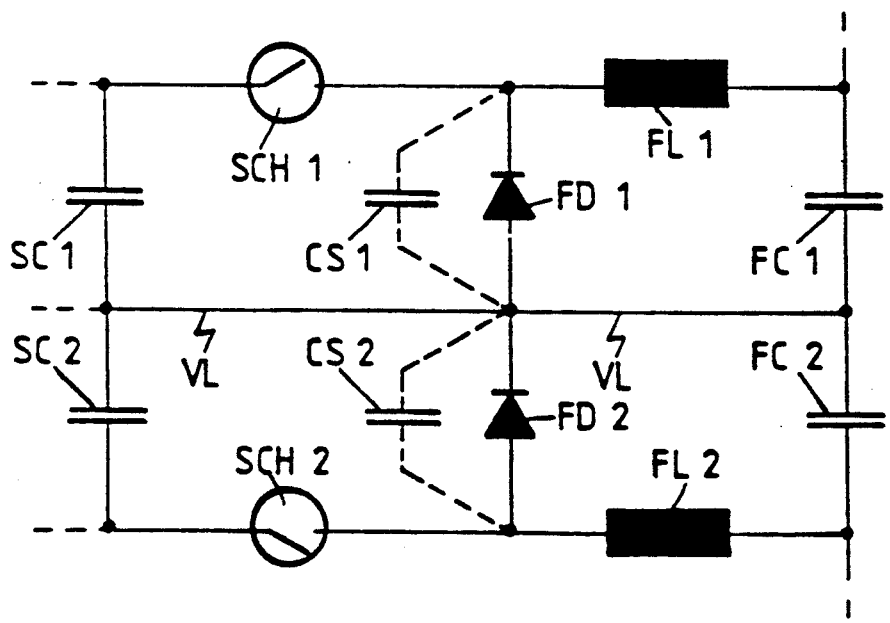

Since, however, the capacitance of the two filter capacitors SC1 and SC2 is very high and they thus constitute a short circuit for the switching oscillation, the output capacitances CS1 and CS2 of the two switches SCH1 and SCH2, respectively, in reality lie in parallel with the respective free running diode FD1 and FD2, respectively, as can be seen in the section of the equivalent circuit diagram for FIG. 10 shown in FIG. 11.

These capacitances CS1 and CS2 are charged to $U_B$ when switches SCH1 and SCH2 are closed and, once the switches are opened, are discharged by the current flowing through filter coils FL1 and FL2, respectively. Only after the complete discharge of "capacitors" CS1 and CS2 will the current flow in the desired manner through free running diodes FD1 and FD2. The discharging time is here inversely proportional to the current so that this annoying effect becomes noticeable primarily for small current values in the form of the above-described negative crest mode distortions.

In order to reduce these negative crest mode distortions, an advantageous modification of the basic circuits discussed so far for the amplifier module V according to the invention provides that, in the circuits of FIGS. 4 and 5, the two free running diodes FD1 and FD2 each are connected in parallel with a series connection composed of a resistor R1 and R2, respectively, and a further switch SCH3 and SCH4, respectively. The latter operate in push-pull with the two "main switches" SCH1 and SCH2 and take care of the discharging of switching capacitances CS1 and CS2.

Advantageously, a delay or dead time is provided between opening (closing) of the main switches SCH1 and SCH2 and closing (opening) of "discharge switches" SCH3 and SCH4, with the duration of this delay or dead time preferably corresponding approximately to the discharge periods of switching capacitances CS1 and CS2 for high current values, that is in the positive crest mode and in the carrier mode, so that in the positive crest mode and in the carrier mode the recharging power flows off through load resistor R and only in the negative crest mode is it consumed in discharging resistors R1 and R2.

Since during this time, however, only small discharge currents flow, the efficiency of the amplifier module is only insignificantly worsened by this measure with a simultaneous considerable improvement of the quality values of the output signal (lower degree of distortion). For optimization it is of advantage to make the delay time between opening (closing) of the main switches SCH1 and SCH2 and closing (opening) of the discharging switches SCH3 and SCH4 variable as a function of the current values so that switches of a smaller switching power (and generally correspondingly shorter switching times) can be employed as discharging switches.

In order to realize the switches, either an individual switch or a plurality of switches connected in series and/or in parallel must be provided as a function of the voltage or the current to be switched.

Preferably semiconductor switches are employed as switches. Of the presently available components, MOS field effect transistors (MOSFET), static induction transistors (SIT), static induction thyristors (SITh), gate turn-off thyristors (GTO), cascade or cascade circuits, etc. are applicable for this purpose.

However, from this series of component types, the MOSFET is at present the most favorable since it permits the realization of very short switching times (and thus very low switching losses). Moreover, it does not involve the storage times typical for bipolar components. Furthermore, a parallel connection of several MOSFET's poses no problems since their forward resistance, in contrast to that of bipolar transistors, has a positive temperature coefficient with the result that the forward resistance of a MOSFET increases with increasing temperature and the forward current decreases correspondingly so that the total current to be carried is automatically distributed uniformly to the parallel connected MOSFET's and overloading of individual MOSFET's is thus prevented.

In order to prevent, in the case of a drop in the load, that is, when the connection to the load resistor is interrupted, the then unattenuated lowpass filters in the amplifier module V according to the invention from oscillating at twice the output voltage 2U at point A in FIGS. 4 and 5, a further advantageous modification of the basic circuit according to the invention includes a cap diode KD1 and KD2, respectively, which is connected from amplifier output A and B, respectively, to output P3 and P4, respectively, of the associated direct voltage mains unit UB1 and UB2, respectively, which "clamps" these overshoots in the voltages, that is, cuts them off. Diodes KD1, KD2, need not be very fast, that is, $t_{rr}$ may be high. They need only be able to cap the oscillations at the resonant frequency of the lowpass filters (which, when employed as modulation amplifiers for a transmitter, lies in the kHz range).

To turn off the entire amplifier module V, for example in cases of malfunction, an advantageous modification of the basic circuit according to the invention provides that the mains transformer TR in the circuits of FIGS. 4 and 5 may be separated from the remainder of the circuit by power protection relays RE1-RE3 or by control gates.

To this point, the solution according to the invention and the advantages resulting therefrom, in principle, have been described in greater detail for an example of a single amplifier module V according to the invention as shown in FIGS. 4-11.

However, these advantageous become even more clearly evident if, in order to produce high output voltages (for example for the modulation of an RF end stage in a high power transmitter), one connects in series on their output sides a plurality of these amplifier modules V according to the invention, each in itself a complete power amplifier, as this will be described in greater detail with reference to FIGS. 12-22.

The power amplifier according to the invention as shown in FIG. 12 is composed of a plurality of complete amplifier modules $V_1$-$V_N$ as shown in FIG. 4 or 5, whose outputs are connected in series. Each amplifier module is composed of a secondary connected switching amplifier component $S_1$-$S_N$ and a subsequently connected lowpass filter component $T_1$-$T_N$, with the switching amplifier components $S_1$-$S_N$ each being connected by way of three connecting lines with the associated lowpass filter component $T_1$-$T_N$, namely the two outer connecting lines and the "symmetrical" center connecting lines $VL_1$-$VL_N$ according to the invention.

The actuation of the individual switching amplifiers is effected by way of a control circuit ST in which the pulse trains required for actuation, here, for example, phase synchronous pulse duration modulated pulse trains, are formed from the analog input signal, here, for example, the modulating low frequency signal NF. The load is assumed to be, for example, an ohmic resistor R which, when the power amplifier according to the invention is used as a modulation amplifier for an amplitude modulated high power transmitter, represents the anode modulated RF end stage.

Thus, in this example of the use of a modulation amplifier for an anode modulated high power transmitter, the individual amplifier modules $V_1$-$V_N$ are complete LF amplifier modules which at their outputs furnish the analog LF input signal amplified by a certain factor and provided with a direct voltage component that corresponds percentage wise to the carrier power and whose series connection, by summing up these phase synchronously amplified LF input signals, furnishes the LF modulated direct operating voltage for the anode modulated RF end stage that is connected in series with the modulation amplifier.

Since the switching amplifiers $S_1$-$S_N$ (more precisely, the series connected direct voltage mains units UB1 and UB2) of all amplifier modules $V_1$-$V_N$ are theoretically switched on and off simultaneously, in practice more or less simultaneously, the power amplifier according to the invention acts at its output like a conventional pulse duration modulation amplifier ("PDM amplifier") which includes only one switching element (generally a switching tube) actuated by a pulse duration modulated pulse train.

If such a PDM amplifier is employed as the modulation amplifier of an anode modulated high power transmitter, the modulation is generated by periodic switching ("chopping") of the direct operating voltage of the RF end stage, with the duration of the switching pulses being proportional to the respective amplitude of the modulating LF signal. The switching frequency must here be higher than the maximum permissible frequency of the modulating LF signal (according to the sampling theorem, at least twice as high) and lower than the lowest carrier frequency generated in the RF stage.

In contrast to the control methods disclosed in DE-A1-3,044,956 and EP-A1-0,066,904, in which the analog input signal is amplified in quantized form with the aid of the series connected switching amplifiers ("PSM method"), the PDM control method ("PDM method") operates continuously, that is the width and duration of the switching pulses at the output of a PDM amplifier change continuously with the momentary value of the analog input signal so that, in the latter method, the difficulties that arise with respect to maintaining the required quality values of a transmitter (distortion factor, noise, marginal transmissions, etc....) as a result of the quantization are greatly reduced.

However, the switching frequency of the switches is generally greater in the "PDM method" than in the "PSM method", which in the past resulted in a noticeably higher switching power loss and thus poorer efficiency. With the present state of development of power semiconductors (such as, for example, MOS field effect transistors (MOSFET) or static induction thyristors, etc.) this basic drawback has become practically insignificant so that the easier and more reliable realization of the required quality values with the PDM method will be decisive in future developments, at least in connection with high power transmitters, since the overall efficiency realizable with the two control methods is practically the same, at least where the power amplifier according to the invention is concerned.

It is understood that not only the PDM method or the PSM method can be employed to actuate the power amplifier according to the invention as shown in FIG. 12 but also generally any desired pulse modulation method.

FIGS. 13-17 show embodiments of the power amplifier according to the invention as shown in FIG. 12 which are particularly suitable for use as modulation amplifiers in amplitude modulated high power transmitters having an anode modulated RF end stage tube. Today, the maximum output voltage of such a modulation amplifier lies in a range around 30 kV, its rated power is generally far more than 50 kW.

The power amplifier shown in FIG. 13 is composed of N identical amplifier modules $V_1$-$V_N$ according to the invention as shown in FIG. 4 in a three-phase configuration, with the mains transformers of the individual amplifier modules $V_1$-$V_N$ advantageously being combined into a mains transformer TR which includes a set of delta connected primary windings 2 and a number of sets of secondary windings $4_1$-$4_N$ corresponding to the number of amplifier modules as well as a grounded common shielding 3.

Figure 1:
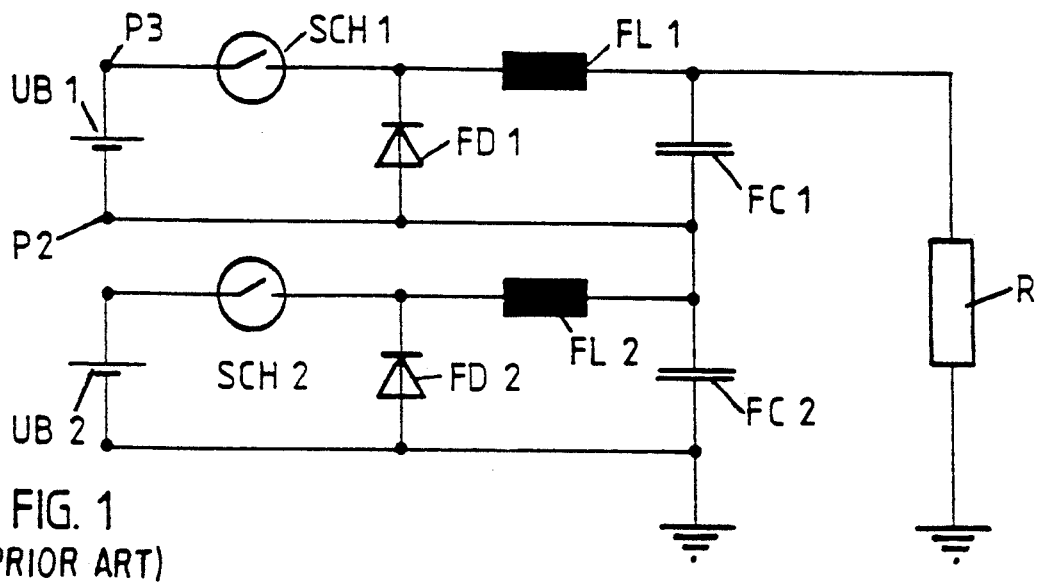
FIG. 1, the already discussed prior art power amplifier equipped with a plurality of individual amplifiers which are connected in series at their output side.
Figure 2:
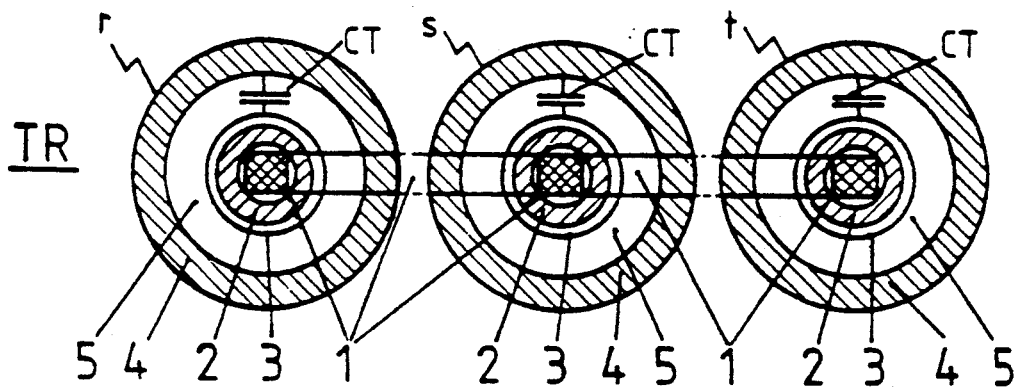
FIG. 2, a cross-sectional view of the already discussed prior art basic structure of a cast resin three-phase transformer.

One advantage of this solution compared to the solution disclosed in DE-A1-3,502,135 (see FIG. 1) is that the number of secondary transformer windings is cut in half by the use of double mains units so that for that reason alone, the power losses in connection with the build-up capacitances of the mains transformer are generally lower.

Reductions in power in the amplifier according to the invention are effected either by the enforced turn-off of individual amplifier modules by means of the switches within the amplifier modules themselves or advantageously by the power protection relays (RE1-RE3 in FIG. 5) provided in each case between transformer TR and rectifier circuits (G1-G6 in FIG. 5) or by control gates, since in the latter case the respective modules can be turned off even in the case of alloyed-through (conducting) semiconductor switches.

The power amplifiers of FIGS. 14 and 15 differ from the amplifier of FIG. 13 in that a coupling capacitor $KC_1$-$KC_N$ (FIG. 14) or a rejection circuit $SK_1$-$SK_2$ (FIG. 15) tuned to triple the mains frequency whose significance will be described below is disposed in each one of the throughgoing connection lines $VL_1$-$VL_N$ of the individual modules $V_1$-$V_N$ between the junctions $P2_1$-$P2_N$ of the series connected direct voltage mains units (UB1, UB2 of FIG. 4 or 5) and the wye points $P1_1$-$P1_N$ of the individual modules $V_1$-$V_N$.

The power amplifier of FIG. 16 differs from the amplifier of FIG. 13 in that the individual lowpass filters in the amplifier modules $V_1$-$V_N$ are configured in two stages as shown in FIG. 5.

The power amplifier of FIG. 17 differs from the amplifier of FIG. 13 in that a separate lowpass filter FL, FC is connected subsequent to the power amplifier.

Figure 3:
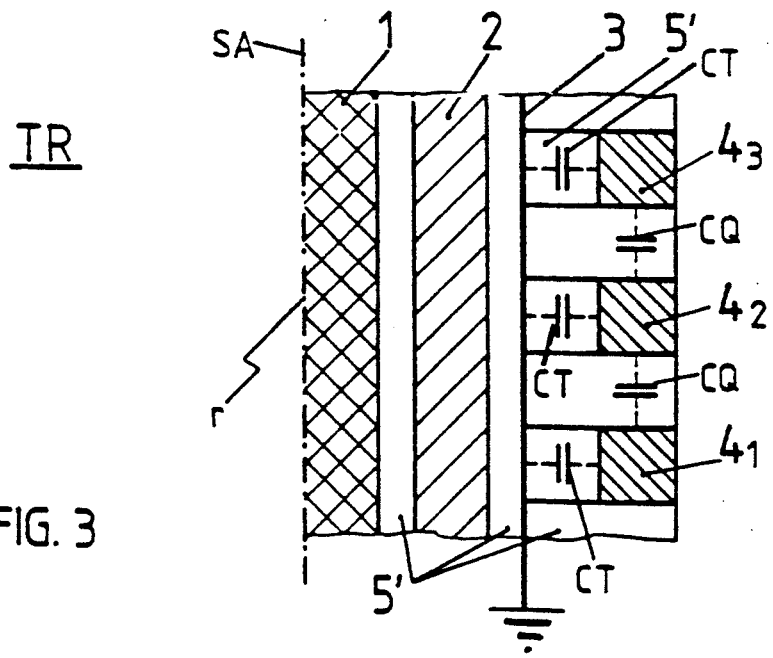
FIG. 3, a longitudinal sectional view of the already discussed basic structure of the leg of a three-phase transformer filled with liquid insulating material and configured in chamber winding technology on the secondary side, the transformer including one primary winding and a plurality of secondary windings.

In FIGS. 13-17, the corresponding shielding capacitances CT and transverse capacitances CQ are shown, for the sake of clarity, as true capacitors (identified by solidly drawn connecting lines) and not as in FIG. 3 as build-up specific capacitances (identified by dashed connecting lines). But this is done only to clarify that these capacitances are integral components of the subsequently connected lowpass filters in the individual amplifier modules $V_1$-$V_N$. For reasons of clarity, these figures also show no further details regarding the structure of the mains transformer employed (iron core, insulating materials, etc.), which, however, must nevertheless be considered in a realization of the power amplifiers according to the invention.

For the case that a power amplifier according to the invention, for example as shown in FIG. 13, is constructed with identical amplifier modules according to FIG. 4 or 5, a simple recursion formula results for a calculation of the equivalent capacitance $C_n$ which is composed of the capacitances FC of the series connected capacitors FC1, FC2 of the lowpass filters in the individual amplifier modules ($V_1$-$V_N$) and the respectively parallel connected shielding capacitances CT of the individual amplifier modules $V_1$-$V_N$ as well as the series connected transverse capacitances CQ between the spatially adjacent secondary windings $4_1$-$4_N$, with the shielding capacitances CT each being connected, in a simplified equivalent circuit diagram (FIG. 18), at one end with the common junction $P8_1$-$P8_N$ of the two capacitors FC1 and FC2 of the corresponding amplifier module $V_1$-$V_N$ and at the other end to ground, while the transverse capacitances CQ are each connected in parallel with two directly series connected filter capacitors FC1 and FC2 of two adjacent amplifier modules $V_1$-$V_N$ in such a manner that they are each connected to the respective junctions $P8_1$-$P8_N$ of adjacent amplifier modules $V_1$-$V_N$, with VA being the amplifier output terminal that is not connected to ground.

For a derivation of the recursion formula, reference is made to FIG. 19.

FIG. 19a essentially is an equivalent circuit diagram of FIG. 18 in simplified form including the series connected filter capacitors at capacitance FC as well as the shielding capacitances CT and the transverse capacitances CQ of the individual amplifier modules $V_1$-$V_N$.

According to FIG. 19b, the individual transverse capacitances CQ and the series connections of two filter capacitors at capacitance FC which are connected in parallel therewith can each be combined into a series connection of two capacitors at capacitance $\overline{FC}$, with a sample calculation indicating that $$\overline{FC} = FC + 2\, CQ \tag{1}$$

The recursion formula for the equivalent capacitance $C_N$ of FIG. 19c can now be derived from FIG. 19b.

Starting with an initial value $C_1$ of $$C = \frac{[FC + CT] \cdot \overline{FC}}{[FC + CT] + \overline{FC}} \tag{2}$$

the recursion formula for $C_V$, where $v = 2 \ldots N-1$, results as follows:

$$C_v = \frac{\left(\frac{C_{v-1} \cdot \overline{FC}}{C_{v-1} + \overline{FC}} + CT\right) \cdot \overline{FC}}{\left(\frac{C_{v-1} \cdot \overline{FC}}{C_{v-1} + \overline{FC}} + CT\right) + \overline{FC}} \tag{3}$$

and for $C_N$ as follows:

$$C_N = \frac{\left(\frac{C_{N-1} \cdot \overline{FC}}{C_{N-1} + \overline{FC}} + CT\right) \cdot FC}{\left(\frac{C_{N-1} \cdot FC}{C_{N-1} + FC} + CT\right) + \overline{FC}} \tag{4}$$

where N is the number of amplifier modules.

The difference in formulas (3) and (4) has its reason in the fact that in recursion formula (4) for $C_N$, the filter capacitance FC of filter capacitor FC1 must additionally be considered in the uppermost amplifier module $V_N$ which has no transverse capacitance CQ connected in parallel (see in this connection FIG. 18 or 19).

For a power amplifier according to FIG. 13 with three-phase amplifier module configurations according to FIG. 4, there result, according to Equations (2) to (4), for example for CF = 3.84 μF and employing cast resin three-phase transformers at CT = 100 pF (that is, about 33 pF per secondary winding of an amplifier module) and CQ = 1500 pF (that is, about 500 pF between two adjacent secondary windings of a leg), the following equivalent capacitances:

$$\left. \begin{array}{lll} N = 1 & C_1 = 1921 & \text{nF} \\ N = 10 & C_{10} = 192.5 & \text{nF} \\ N = 20 & C_{20} = 96.74 & \text{nF} \\ N = 32 & C_{32} = 61.11 & \text{nF} \end{array} \right\} \tag{5}$$

while the series connection of filter capacitors FC1, FC2 of the individual amplifier modules $V_1$-$V_N$ alone (neglecting the shielding and transverse capacitances) results for N = 32 in a total equivalent capacitance $C'_{32} = 60$ nF, which thus differs by only about 1 nF from the previously calculated equivalent capacitance $C_{32}$.

With the aid of the embodiment of the power amplifier according to the invention as shown in FIG. 13 which has N = 32 series connected amplifier modules $V_1$-$V_{32}$ with a maximum output voltage of 1000 Volt in each case, and which are actuated in synchronism by means of pulse duration modulated pulse trains, the advantages of the solution according to the invention will now also be clarified quantitatively.

With the assumption that in the individual amplifier modules $V_1$-$V_N(V_{32})$ of the power amplifier of FIG. 13 the throughgoing connecting line $VL_1$-$VL_N$ ($VL_{32}$) extends from wye point $P1_1$-$P1_N$ only to the junction $P5_1$-$P5_N$ of the two series connected free running diodes and the piece between junctions $P5_1$ and $P8_1$ ... $P5_N$ and $P8_N$ is missing, the shielding capacitances CT in the individual amplifier modules $V_1$-$V_N$, according to the equivalent circuit diagram of FIG. 6, would have their one end connected to ground by way of shielding 3 and their other end to the respectively associated junction $P2_1$-$P2_N$ and thus would not be integrated in the lowpass filters. (For the sake of simplicity, the series connected transverse capacitances CQ of FIG. 13 will be neglected in the comparison calculation below.)

For this case, the energy EV stored in shielding capacitances CT and to be recharged for each switching process results as follows:

$$E_V = \frac{1}{2} \cdot U \cdot CT \cdot \left[\frac{1}{3N}\left(N^2 - \frac{1}{4}\right)\right] \tag{6}$$

and for the power loss $P_V$ incurred in the shielding capacitances:

$$P_V = 2f_S \cdot E_V = f_S \cdot U \cdot CT \cdot \left[\frac{1}{3N}\left(N^2 - \frac{1}{4}\right)\right] \tag{7}$$

where U is the total voltage of the N series connected amplifier modules $V_1$-$V_N$ (thus U = 32 kV) $f_S$ is the switching or "recharging" frequency and CT is the shielding capacitance of an amplifier module.

With, for example, U = 32 kV, CT = 100 pF, N = 32 and $f_S$ = 50 kHz, the power loss for this case, according to Equations (6) and (7) is $P_V$ = 55 kW.

If, however, the wye point $P1_1$-$P1_N$ of the secondary windings $4_1$-$4_N$ of mains transformer TR is connected by way of the throughgoing connecting line $VL_1$-$VL_N$ with the junction $P8_1$-$P8_N$ of the lowpass filters in the individual amplifier modules $V_1$-$V_N(V_{32})$ of the power amplifier of FIG. 13 or if, in other words, the shielding capacitances CT of the individual amplifier modules $V_1$-$V_N$ are integrated, according to the invention, in the lowpass filters, then it will no longer be the high sampling and switching frequency $f_S$ of, for example, 50 kHz that is present at the mains transformer and its build-up capacitances, but only the lower frequency input signal.

However, with a sinusoidal input signal, only the power loss $P_{eff}$ given by the loss factor $$\tan \delta = P_{eff}/P_{react} \qquad (8)$$

is effective as follows:

$$P_{eff} = U^2 \cdot \omega \cdot CT \cdot \tan \delta \cdot \left[ \frac{1}{3N} \left( N^2 - \frac{1}{4} \right) \right] \qquad (9)$$

where $P_{react}$ is the reactive power, $\omega$ is the radian frequency of the sinusoidal input signal, U is the total voltage of the N series connected amplifier modules $V_1$-$V_N$, CT is the shielding capacitance of an amplifier module and tan $\omega$ is the loss factor.

With U=32 kV, CT=100 pF, N=32 and tan $\delta=5\cdot10^{-3}$ (typical for cast resin transformers) there results in this case, according to Equation (9), for a 10 kHz input signal a power loss $P_{eff}=350$ W, and this is independent of the switching frequency.

Compared to the above described case of a comparable "classic" PD amplifier without integration of the build-up capacitances in the lowpass filters, this signifies a reduction of the occurring power loss by more than a factor of 150, namely a reduction from 55 kW to 0.35 kW.

This computational example shows clearly how advantageous it is to integrate, according to the invention, the build-up capacitances of the mains transformers in a modular power amplifier operating according to the PDM control method in the individual lowpass filters.

The pairs of direct voltage mains units (UB1, UB2 of FIG. 4 or 5) which are connected in series on the output side in the individual amplifier modules $V_1$-$V_N$ of the power amplifier of FIG. 13 are connected in a wye pattern, as already mentioned, on their secondary side.

However, in a wye connection the effective value of the hum voltage at triple the mains frequency (that is, at 150 Hz in the generally customary 50 Hz supply network) is 18.3% of the direct output voltage of the mains unit. The consequence of this is that an alternating reactive current at triple the mains frequency flows through the filter capacitor (SC1 and SC2 in FIG. 4 or 5), causing losses in the mains unit and additionally considerably shortening the service life of the filter capacitors which customarily are configured as electrolyte capacitors.

In a direct voltage mains unit operating with a direct output voltage U=500 V and equipped with a filter choke at L=12 mH and a filter capacitor at C=4 mF, there results for a 50 Hz mains frequency a 150 Hz alternating reactive current $i_{REACT}$ of approximately $i_{REACT} \approx U/\omega L \approx 8$ A (C may be neglected here).

In the power amplifier of FIG. 13, this alternating reactive current is generated in each individual one of the 2N direct voltage mains units of the N amplifier modules, with the alternating reactive currents of the pairs of series connected mains units additionally being added in the individual amplifier modules to yield a total alternating reactive current at essentially double the amplitude (in our example 16 A).

In order to reduce this alternating reactive current in the individual amplifier modules, it is possible, as shown in FIG. 14, to connect in the power amplifiers according to the invention, which are actuated by pulse duration or pulse frequency modulated pulse trains, in the throughgoing connecting lines $VL_1$-$VL_N$ of the individual amplifier modules $V_1$-$V_N$ a coupling capacitor $KC_1$-$KC_N$ between the wye point $P1_1$-$P1_N$ and the junction $P2_1$-$P2_N$ of each series connected direct voltage mains unit. In the above mentioned embodiment of a 500 V direct voltage mains unit operating at L=12 mH and C=4 mF, there results, with a coupling capacitor of the capacitance C'=1 $\mu$F, a 150 Hz alternating reactive current $i_{REACT}$ of approximately $i_{REACT} \approx U \cdot \omega C' \approx 0.09$ A (L may be neglected) which, compared to the original value of about 8 A, signifies a reduction by about a factor of 90.

As shown by the example, this measure leads to negligibly small losses due to alternating reactive currents at triple the mains frequency and to a noticeable relief of the filter capacitors of the power amplifier according to the invention. Additionally, the hum of the individual amplifier modules $V_1$-$V_N$ (the noise voltage) is lower and the voltage constancy under changing loads is better.

Since the build-up capacitances (shielding and transverse capacitances, etc.) of the mains transformer lie in the pF range, but the coupling capacitors lie in the $\mu$F range, the integration according to the invention of the build-up capacitances of the mains transformer in the individual subsequently connected lowpass filters is influenced only insignificantly by this additional measure.

Another possibility of reducing the undesirable reactive currents at triple the mains frequency is shown in FIG. 15. There a rejection circuit $SK_1$-$SK_N$ tuned to triple the mains frequency is included, instead of the coupling capacitor, in the individual connecting lines $VL_1$-$VL_N$ between the wye point $P1_1$-$P1_N$ and the junction $P2_1$-$P2_N$. Here the degree of reduction of the alternating reactive current is a function of the quality of the rejection circuit.

If, for example, only four amplifier modules $V_1$-$V_4$ are interconnected in series to form a power amplifier according to the invention, direct current can be conducted through the individual wye points $P_1$-$P_4$. The integration of the buildup capacitances according to the invention in the individual lowpass filters is here effected by the capacitors of the individual $SK_1$-$SK_N$.

In certain applications it may be of advantage to employ, instead of the previously discussed single-stage lowpass filter, a multi-stage lowpass filter, for example a two-stage lowpass filter. There are two ways to integrate such a filter according to the invention. Either, as shown, for example, in FIG. 16, the filter is fully integrated in the individual amplifier modules $V_1$-$V_N$, in which case only the filter capacitors of the respective last filter stage of the individual lowpass filters would have to be connected in series, or, as shown, for example, in FIG. 16, only some of the filter stages are integrated and the remaining stages are connected to follow the power amplifier.

The advantage of the first solution is primarily the full testability of the individual amplifier modules, while the second solution has the primary advantage that manufacturing tolerances in the individual filter members of the first stage are practically unable to have any influence on the quality values of the output signal of the power amplifier.

Another advantage of the power amplifier according to the invention as shown in FIG. 13 resides in the series connections of ohmic resistors R1 and R2, respectively and switches SCH3 and SCH4, respectively, as shown in FIG. 4 or 5, which are connected in parallel with the free running diodes FD1 and FD2, respectively. As already discussed, these switches are operated in push-pull operation complementary to the main switches SCH1 and SCH2, respectively, and render the otherwise harmful output capacitances CSW1 and CS2, respectively, of switches SCH1 and SCH2, respectively, practically ineffective.

If one assumes, for example, that switches SCH3 and SCH4 are realized by MOSFET's, annoying output capacitances occur in addition to the input capacitance which generally causes difficulties during actuation of the components. These output capacitances are composed of the sum of $C_{DS}$ and $C_{GD}$ (Miller capacitance) and typically amount to 1.3 nF, for example, for a commercially available FET (Siemens BSM 81). If, for example, one connects five of these MOSFET's in parallel, a capacitance of about 6.5 nF results which, due to the build-up capacitance of these switches SCH1 and SCH2, respectively, is increased to a total of about 10 nF.

This capacitance CS (CS1 and CS2, respectively, in FIG. 4 or 5), as already mentioned, lies in a first approximation parallel to the corresponding free running diode (FD1 and FD2, respectively, in FIG. 4 or 5) since the capacitance of the associated charging and filter capacitor (SC1 and SC2, respectively, in FIG. 4 or 5) is very high and thus constitutes a short circuit for the switching frequency $f_S$. If several of these amplifier modules are connected in series at their outputs, the capacitances CS of the individual amplifier modules are connected in series in a simplified equivalent circuit diagram and are added to yield a total capacitance of $$CSG = CS/2N \quad (10)$$

where N is the number of amplifier modules.

In a power amplifier, for example, according to FIG. 13, with 32 series connected amplifier modules according to FIG. 4 or 5 and a total voltage U=32 kV, there results, with CS=10 nF and $f_s$=50 kHz a total capacitance CSG=10 nF÷64=156 pF and thus a switching power loss of $P_V = \frac{1}{2} CSG \cdot U^2 \cdot f_S \approx 4$ kW.

With the assumption that the filter chokes (FL1 and FL2, respectively, in FIG. 4) are charged with I=100 A in the positive crest mode (positive amplitude of the LF signal), I=50 A in the carrier or no-crest mode (output signal in the absence of an LF input signal) or I=2A in the negative mode (negative amplitude of the LF signal), the following discharge times t result for the filter chokes, according to Equation (11), based on a capacitance CSG:

$$t = \frac{CSG \cdot U}{I} \quad (11)$$

for $$\begin{array}{ll}
\text{positive crest mode:} & t = 46 \text{ ns} \\
\text{carrier:} & t = 93 \text{ ns} \\
\text{negative crest mode:} & t = 2.34 \text{ μs}
\end{array} \quad (12)$$

From the two equations it follows that in the negative crest mode, that is, if the PDM switching pulses become very narrow, significant distortions of the output signal of the power amplifier may occur.

As already discussed, these distortions are considerably reduced by the use of auxiliary switches (SCH3 and SCH4, respectively, in FIG. 4 or 5) which are operated in push-pull to the main switches.

In the exemplary embodiment, these switches are locked against the main switches by about 100 ns, that is, in the positive crest mode and in the carrier mode, the recharging power flows off through the load resistor R. Only in the negative crest mode is the power consumed in the discharging resistors (R1, R2 in FIG. 4 or 5).

Since, however, only very small discharging currents flow during this time (here: I=2 A), the efficiency of the power amplifier according to the invention as shown in FIG. 13 is worsened only insignificantly by this measure, with the improvements in the quality values of the output signal of the power amplifier (distortion factor, etc.) being simultaneously improved considerably. For optimization it is also of advantage here to make the delay time between the changes in switching state of the main switch and the associated auxiliary switch variable as a function of the current values so that, for example, MOSFET's of a lower switching power can be employed as the auxiliary switches which generally have shorter switching times than the MOSFET's employed in the main switches so that the reduction in efficiency caused by the use of auxiliary switches can be minimized in this way.

Another advantage of this solution is that the filter of a malfunctioning amplifier module continues to be effective.

The invention can be modified and further developed by a person skilled in the art and can be adapted to various applications without this having to be described here in detail.

For example, it is of advantage, as shown in FIG. 20, to bring the secondary side terminals A1–A4 and A5–A8, respectively, of two spatially adjacent sets of secondary windings $4_1$ and $4_2$ of the mains transformer TR of FIGS. 13–17 out of the transformer housing by way of a common insulated support 6.

According to FIG. 21, such an insulated support 6 can be produced, for example, of cast resin and can be inserted into the exterior wall 7 of a mains transformer filled with oil 8. Terminals A1 to A8 here correspond to those of FIG. 20.

FIG. 22 is a top view of an insulated support according to FIG. 21. The voltage data given at the outer ring are exemplarily selected effective values for direct voltage mains units (UB1, UB2 in FIG. 4 or 5) which each generate direct voltages of approximately ±670 V with respect to junction P2 in FIG. 4 or 5.

In order to reduce the harmful shielding capacitances between the secondary windings and the shielding, the secondary windings of the mains transformer should advantageously be designed as so-called chamber windings (see FIG. 3). But layered windings in which each secondary winding forms a layer are also conceivable. However, in that case, the capacitance configuration is different than the previously discussed configuration.

Moreover, it is of advantage to employ, instead of a single three-phase transformer having N sets of secondary windings of this type, two three-phase transformers each having one half (N/2) of the sets of secondary windings of which advantageously the one transformer has a set of wye connected primary windings and the second transformer has a set of delta connected primary windings, as shown in FIG. 23, so that a fictional twelve-pulse circuit with a correspondingly reduced mains harmonics component exists. If this principle is employed, the number of passages per transformer is reduced to N/4 which brings about advantages in the construction of such transformers. As an alternative, two identical transformers can be employed in which the phases are exchanged and which on their primary sides are connected in the form of a polygon with a 15° offset. Moreover, it is of advantage to conduct the pulse trains to actuate the switches in the amplifier modules optoelectronically by way of light waveguides. In this case, it is recommended to obtain the required additional current supplies for the switches and the optoelectronic system from the secondary voltage of the mains transformer (TR in FIGS. 4 and 5).

Finally, it may be of advantage in some cases to employ, instead of several identical amplifier modules, several not identical amplifier modules (for example having their output voltages arranged in binary stages).

I claim:

1. A power amplifier for amplifying an analog input signal, the amplifier including:
   at least two individual amplifiers directly connected in series on their output sides and each composed of a secondary-side connected switching amplifier and a subsequently connected lowpass filter,
   wherein the switching amplifier includes a direct voltage mains unit connected to a mains transformer equipped with grounded shielding spatially adjacent secondary windings, a free running diode connected in parallel therewith, and a first switch controlled by a pulse train derived from the input signal;
   wherein said lowpass filter includes a filter coil connected in series with the first switch, and a filter capacitor connected subsequent to the filter coil and in parallel with the free running diode, an upper cut-off frequency of said lowpass filter being selected so that the analog input signal is present at an output of said lowpass filter amplified and essentially without distortion;
   wherein every two directly series connected individual amplifiers form an amplifier module; and
   wherein normally harmful transformer capacitances of the mains transformer, including at least one of shielding capacitances of the mains transformer between the shielding and the secondary windings, and transverse capacitances, are components of the individual lowpass filters of said series connected individual amplifiers, said at least two individual amplifiers include means for effectively connecting the normally harmful transformer capacitances in parallel with the filter capacitor of at least one of said lowpass filters, by way of a through-going connecting line between at least one secondary winding of the mains transformer and at least one end point of a lowpass filter.

2. A power amplifier according to claim 1, wherein design of the individual lowpass filters with respect to selection of their upper cut-off frequency includes the normally harmful transformer capacitances.

3. A power amplifier according to claim 1, wherein:
   in the at least two amplifier modules connected in series on the output side, the direct voltage mains units, the free running diodes and the filter capacitors of the at least two individual amplifiers are each connected in series with one another;
   the mains transformer is a three-phase mains transformer common to the direct voltage mains units, said three-phase mains transformer having secondary windings that are interconnected at a wye point;
   junctions between the series connected direct voltage mains units, the series connected free running diodes and the series connected filter capacitors are connected with the wye point by way of the throughgoing connecting line; and
   end points of three series connections composed of direct voltage mains units, free running diodes and filter capacitors, are each connected with one another by way of the series connection of the first switch and filter coil, the end points of the series connection of the free running diodes being connected in each case between the first switch and the filter coil.

4. A power amplifier according to claim 3, wherein:
   the series connected direct voltage mains units in an amplifier module are realized by two three-phase, wye connected recitifier circuits which are connected in anti-parallel with ends of the second winding of the mains transformer opposite the wye point and which generate, with respect to the wye point, two direct voltages of different polarity, each said recitifier circuit being equipped with a subsequently connected filter member composed of a filter choke and a filter capacitor;
   the filter capacitors of the two filter members are connected in series and their common junction is the junction of the two series connected direct voltage mains units where they are directly connected to the wye point by way of the throughgoing connecting line.

5. A power amplifier according to claim 3, wherein:
   a series connection of a further switch and a resistor is connected in parallel with the respective free running diode between the series connected direct voltage mains units and the series connected free running diodes in each amplifier module; and
   each of said further switches are connected to complement the associated first switch that is, to operate in push-pull.

6. A power amplifier according to claim 3, wherein each one of the end points of the series connection of the direct voltage mains units is connected with its associated amplifier module output by way of a cap diode.

7. A power amplifier according to claim 3, wherein the mains transformer includes power protection relays disposed on the secondary side of the mains transformer.

8. A power amplifier according to claim 3, wherein the mains transformer comprises a two three-phase mains transformers each having a primary winding and a number of secondary windings corresponding to one-half the number of amplifier modules; and the primary windings of one mains transformer are connected in a wye pattern and the primary windings of the other mains transformer are connected in a delta pattern.

9. A power amplifier as defined in claim 3, wherein the amplifier modules are of similar construction.

10. A power amplifier as defined in claim 3, wherein the connecting line includes a coupling capacitor.

11. A power amplifier as defined in claim 3, wherein the connecting line includes a rejection circuit.

12. A power amplifier according to claim 1, wherein:
in the at least two amplifier modules connected in series on the output side, the direct voltage mains units and the free running diodes of the at least two individual amplifiers are each connected in series with one another;
the mains transformer is a three-phase mains transformer common to the direct voltage mains units, said three-phase mains transformer having secondary windings that are interconnected at a wye point;
junctions between the series connected direct voltage mains units and the series connected free running diodes are connected with the wye point by way of the throughgoing connecting line; and
said lowpass filters in the amplifier modules are each composed of a plurality of series connected individual filter stages;
the individual filter stages each include a filter coil and a filter capacitor connected subsequent to the respective filter coil;
the filter coils of the individual filter stages of a lowpass filter are each connected in series and the filter capacitors of the individual filter stages of a lowpass filter are each connected in parallel with one another;
filter capacitors of equivalently ranked filter stages of the two lowpass filters are each connected in series; and
junctions between two respectively series connected filter capacitors are connected directly with the wye point by way of the throughgoing connecting line
end points of the series connections composed of direct voltage mains units, free running diodes and filter capacitors, are each connected with one another by way of the series connection of the first switch and the filter coils, the end points of the series connection of the free running diodes being connected in each case between the first switch and the series connected filter coil.

13. A power amplifier according to claim 1, wherein the mains transformer is a three-phase mains transformer having a primary winding and a number of secondary windings corresponding to the number of amplifier modules, a common shielding and the primary windings are connected in a delta pattern.

14. A power amplifier according to claim 13, wherein an insulated support is provided in the mains transformer for every two amplifier modules and terminals for the two wye points and terminals for the ends of the two sets of secondary windings which are not connected at the wye point are brought out of the mains transformers.

15. A power amplifier according to claim 1, wherein the pulse train derived from the input signal is a pulse frequency modulated pulse train having a constant pulse duration.

16. A power amplifier according to claim 1, wherein the pulse train derived from the input signal is a pulse duration modulated pulse train having a constant switching frequency.

17. A power amplifier according to claim 1, wherein the amplifier modules all have the same configuration and furnish essentially the same output signals.

18. A power amplifier according to claim 1, further comprising an additional lowpass filter connected to the outputs of the amplifier modules.

19. A power amplifier according to claim 1, used as a modulation amplifier for anode modulated high power radio transmitters.

* * * * *